(12) United States Patent
Fujinuma et al.

(10) Patent No.: US 11,482,672 B2
(45) Date of Patent: Oct. 25, 2022

(54) SOLID JUNCTION-TYPE PHOTOELECTRIC CONVERSION ELEMENT, PEROVSKITE FILM, AND PHOTOELECTRIC CONVERSION MODULE

(71) Applicant: SEKISUI CHEMICAL CO., LTD., Osaka (JP)

(72) Inventors: Naohiro Fujinuma, Glassboro, NJ (US); Junichiro Anzai, Tsukuba (JP); Sachiko Satou, Tsukuba (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 658 days.

(21) Appl. No.: 16/321,572

(22) PCT Filed: Aug. 2, 2017

(86) PCT No.: PCT/JP2017/028089
§ 371 (c)(1),
(2) Date: Jan. 29, 2019

(87) PCT Pub. No.: WO2018/025920
PCT Pub. Date: Feb. 8, 2018

(65) Prior Publication Data
US 2021/0193929 A1 Jun. 24, 2021

(30) Foreign Application Priority Data

Aug. 2, 2016 (JP) .............................. JP2016-152161

(51) Int. Cl.
*H01L 51/44* (2006.01)
*H01L 31/0264* (2006.01)
(Continued)

(52) U.S. Cl.
CPC ....... *H01L 51/0032* (2013.01); *H01G 9/2036* (2013.01); *H01L 31/0264* (2013.01); *H01L 51/424* (2013.01); *H01L 51/44* (2013.01)

(58) Field of Classification Search
CPC ... H01L 51/0032; H01L 51/424; H01L 51/44; H01L 31/2036; H01G 9/2036
See application file for complete search history.

(56) References Cited

U.S. PATENT DOCUMENTS

| 2015/0129034 A1* | 5/2015 | Snaith .................. H01G 9/2004 136/258 |
| 2016/0276053 A1 | 9/2016 | Navarro et al. |
| 2018/0212086 A1* | 7/2018 | Kurebayashi ........... H01L 31/04 |

FOREIGN PATENT DOCUMENTS

| CN | 105359289 | 2/2016 |
| EP | 2 966 703 | 1/2016 |

(Continued)

OTHER PUBLICATIONS

Hofmann et al., An Alternative Anionic Polyelectrolyte for Aqueous PEDOT Dispersions: Toward Printable Transparent Electrodes, Angewandte Chemical International, Communications, Conducting Polymers, vol. /Issue 54, pp. 8506-8510 (Year: 2015).*

(Continued)

*Primary Examiner* — Jayne L Mershon
(74) *Attorney, Agent, or Firm* — Wenderoth, Lind & Ponack, L.L.P.

(57) ABSTRACT

A solid junction-type photoelectric conversion element (10) including a first conductive layer (2), an electric power generation layer (4), and a second conductive layer (6), which are laminated in this order, wherein the electric power generation layer (4) comprises: a perovskite compound represented by a composition formula $ABX_3$, formed of an (Continued)

organic cation A, a metal cation B and a halide anion X, and a compound Z having no perovskite structure.

11 Claims, 3 Drawing Sheets

(51) Int. Cl.
*H01L 51/00* (2006.01)
*H01G 9/20* (2006.01)
*H01L 51/42* (2006.01)

(56) References Cited

FOREIGN PATENT DOCUMENTS

| | | |
|---|---|---|
| EP | 3 331 041 | 6/2018 |
| FR | 3 012 462 | 5/2015 |
| WO | 2015/092397 | 6/2015 |
| WO | 2015/127494 | 9/2015 |
| WO | 2016/083783 | 6/2016 |
| WO | 2017/022687 | 2/2017 |
| WO | 2017/121984 | 7/2017 |

OTHER PUBLICATIONS

International Search Report dated Oct. 31, 2017 in International (PCT) Application No. PCT/JP2017/028089.
Michael M. Lee et al., "Efficient Hybrid Solar Cells Based on Meso-Supeistuctured Organometal Halide Perovskites" Science, vol. 338, 2012, pp. 643-647.
Nam Joong Jeon et al., "Solvent engineering for high-performance inorganic-organic hybrid perovskite solar cells" Nature Materials, vol. 13, 2014, pp. 897-903.
Masi, S. et al., "Growing perovskite into polymers for easy-processable optoelectronic devices", Scientific Reports, vol. 5, Jan. 12, 2015, pp. 1-7.
Office Action dated Nov. 16, 2020 in European Patent Application No. 17 837 022.7.
Extended European Search Report dated Feb. 19, 2020 in European Patent Application No. 17837022.7.
Li et al., "Improved performance and stability of perovskite solar cells by crystal crosslinking with alkylphosphonic acid ω-ammonium chlorides," Nature Chemistry, Aug. 17, 2015, vol. 7, pp. 703-711.
Office Action dated Apr. 19, 2022 in Chinese Patent Application No. 201780047482.8, with English-language translation.

* cited by examiner

SOLID JUNCTION-TYPE PHOTOELECTRIC CONVERSION ELEMENT, PEROVSKITE FILM, AND PHOTOELECTRIC CONVERSION MODULE

TECHNICAL FIELD

The present invention relates to a solid junction-type photoelectric conversion element, a perovskite film, and a photoelectric conversion module.

BACKGROUND ART

In recent years, it has been reported that a solid junction-type photoelectric conversion element including an electric power generation layer containing a perovskite compound exhibits high photoelectric conversion efficiency (Non-Patent Document 1), and such a solid junction-type photoelectric conversion element has been attracting attention as a new photoelectric conversion element. This report was followed by successive reports on further improvements in photoelectric conversion efficiency (for example, Non-Patent Document 2).

DESCRIPTION OF PRIOR ART

Non-Patent Document

Non-Patent Document 1: "Efficient Hybrid Solar Cells Based on Meso-Superstructured Organometal Halide Perovskites" Science, 2012, 338, p 643-647.
Non-Patent Document 2: "Solvent engineering for high-performance inorganic-organic hybrid perovskite solar cells" Nature Materials 2014, 13, p 897-903.

DISCLOSURE OF INVENTION

Problems to be Solved by the Invention

The present inventors have found that perovskite layers constituting electric power generation layers of conventional solid junction-type photoelectric conversion elements have a problem that a leakage current tends to occur. The present inventors also found that there is a problem that leakage current occurs more notably due to heat generated during the use of a solid junction-type photoelectric conversion element.

The present invention provides a solid junction-type photoelectric conversion element with less generation of leakage current and excellent heat resistance, and a photoelectric conversion module including the same.

Means to Solve the Problems

The present inventors investigated the cause of occurrence of the leakage current described above, and speculated that pinholes and/or cracks occur in the perovskite layer, through which the first conductive layer and the second conductive layer are short-circuited to thereby cause the leakage current. Further, the cause of occurrence of pinholes and/or cracks was speculated to reside in nonuniform crystallization during the formation of the perovskite structure. For example, it seemed conceivable that, when a raw material solution containing raw materials or a precursor of a perovskite compound is applied to a conductive support layer and the solvent contained in the resulting coating is dried off to cause crystallization, the flow of the solvent makes crystallization nonuniform, thus resulting in occurrence of pinholes and cracks. Another probable cause was that the perovskite crystal layer after production is not stabilized, and pinholes and cracks are caused due to physical stress, heat, light, etc. Furthermore, it was considered that the structural defects of the perovskite crystal layer grows larger due to the heat during the use of the solid junction-type photoelectric conversion element including the perovskite crystal layer, whereby the performance of the conversion element deteriorates over time.

Therefore, as a result of extensive studies on the composition of the raw material solution, the present inventors found that the above-mentioned defects can be ameliorated by adding a specific compound Z as an additive, and completed the present invention. That is, the present invention is as follows.

[1] A solid junction-type photoelectric conversion element comprising a first conductive layer, an electric power generation layer, and a second conductive layer, which are laminated in this order, wherein the electric power generation layer comprises:

a perovskite compound represented by a composition formula $ABX_3$, formed of an organic cation A, a metal cation B and a halide anion X, and a compound Z having no perovskite structure.

[2] The solid junction-type photoelectric conversion element according to [1], wherein the compound Z comprises two or more elements z belonging to Groups 14 to 16 of the periodic table.

[3] The solid junction-type photoelectric conversion element according to [2], wherein the two or more elements z include a first element z having a highest electronegativity and a second element z having a lowest electronegativity among the elements z, and a difference in electronegativity between the first element z and the second element z is 0.1 or more.

[4] The solid junction-type photoelectric conversion element according to any one of [1] to [3], wherein the compound Z has at least one group selected from an ether group (—O—), a hydroxyl group (—OH), a carbonyl group (>C=O), a sulfo group (—$SO_3H$), a thiol group (—SH), a sulfenyl group ($R^1S$—; $R^1$ is a monovalent organic group), a sulfonyl group (—S(=O)$_2$—), a sulfite group ($R^1O$—S(=O)—O—; $R^1$ is a monovalent organic group), a phosphine group (>P—), a phosphono group {($R^1O)_2$P(=O)—; each $R^1$ independently represents a monovalent organic group)}, and a $R^1O$— group ($R^1$ is a monovalent organic group).

[5] The solid junction-type photoelectric conversion element according to any one of [1] to [3], wherein the compound Z has a group having a structure represented by the following formula (1):

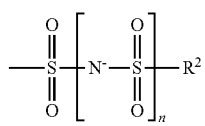

(1)

wherein $R^2$ is an alkyl group having 1 to 15 carbon atoms, a halogenated alkyl group having 1 to 15 carbon atoms, an aryl group having 6 to 15 carbon atoms, a halogenated aryl group having 6 to 15 carbon atoms, or a halogen atom, and n is 0 or 1.

[6] The solid junction-type photoelectric conversion element according to [5], wherein the compound Z is a compound having a structure represented by the following formula (2):

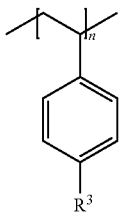

(2)

wherein each of $R^3$ is independently a group represented by the formula (1) or a hydrogen atom, and at least one of multiple groups $R^3$ is a group represented by the formula (1), and n is an integer from 2 to 30,000.

[7] The solid junction-type photoelectric conversion element according to any one of [1] to [4], wherein the compound Z is a compound having a structure represented by the following formula (3):

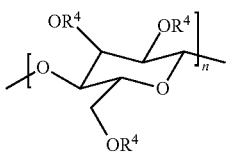

(3)

wherein each $R^4$ independently represents a hydrogen atom or a hydrocarbon group, and n is an integer of from 2 to 30000.

[8] The solid junction-type photoelectric conversion element according to any one of [1] to [7], which comprises at least two compounds as the compound Z.

[9] A perovskite film, comprising: a perovskite compound represented by a composition formula $ABX_3$, formed of an organic cation A, a metal cation B and a halide anion X; and the compound Z described in any one of [5] to [7].

[10] A photoelectric conversion module, comprising at least one solid junction-type photoelectric conversion element according to any one of [1] to [8].

Effect of the Invention

According to the present invention, it is possible to provide a solid junction-type photoelectric conversion element with reduced generation of leakage current and excellent heat resistance.

DESCRIPTION OF THE EMBODIMENTS

Hereinbelow, the present invention is described based on the preferred embodiments thereof with reference to the drawings which, however, should not be construed as limiting the scope of the present invention.

In the present specification, the expressions "film" and "layer" are indiscriminately used unless otherwise specified. Further, the solid junction-type photoelectric conversion element may also be simply referred to as "photoelectric conversion element", and the organic-inorganic perovskite compound may also be simply referred to as "perovskite compound".

<<Solid Junction-Type Photoelectric Conversion Element>>

[Laminate Structure]

Figure 1:
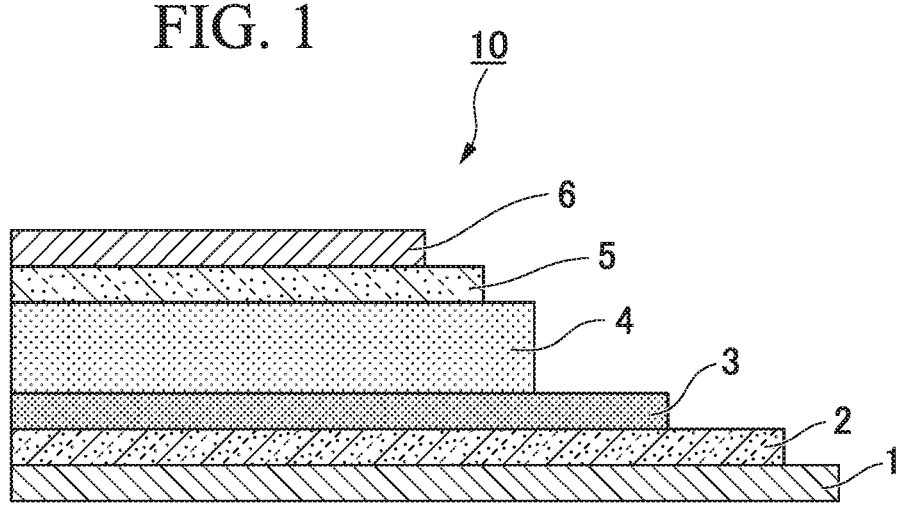
FIG. 1 is a cross-sectional view of a first embodiment of the solid junction-type photoelectric conversion element according to the present invention.

As shown in FIG. 1, the first embodiment of the photoelectric conversion element 10 of the present invention has a laminate structure including a substrate 1, a first conductive layer 2, a blocking layer 3, an electric power generation layer 4 containing an organic/inorganic perovskite compound, a P-type semiconductor layer 5, and a second conductive layer 6 which are laminated in this order.

The substrate 1 is an optional component for supporting other layers, and may be omitted when the other layers have self-supporting property.

The blocking layer 3 and the P-type semiconductor layer 5 are optional layers used for preventing loss of electromotive force and enhancing photoelectric conversion efficiency. Thus, for example, as in the case of the photoelectric conversion element 20 shown in FIG. 2, it is also possible to adopt a laminate structure in which the substrate 1, the first conductive layer 2, the electric power generation layer 4, and the second conductive layer 6 are laminated in this order.

Each of the photoelectric conversion elements 10, 20 of the respective embodiments includes the first conductive layer 2, the electric power generation layer 4, and the second conductive layer 6 laminated in this order.

Hereinbelow, each of the layers will be described one by one.

[Substrate 1]

The material of the substrate 1 is not particularly limited, and, for example, a transparent substrate used in a conventional photovoltaic cell can be mentioned. Examples of the substrate 1 include substrates made of glass or synthetic resins, and flexible films made of synthetic resins.

The substrate 1 may be a substrate or foil made of a metal. In this case, it is preferable that the second conductive layer to be described later is a transparent conductive layer.

Examples of the synthetic resin include a polyacrylic resin, a polycarbonate resin, a polyester resin, a polyimide resin, a polystyrene resin, a polyvinyl chloride resin, and a polyamide resin. Among these, a polyester resin, particularly polyethylene naphthalate (PEN) or polyethylene terephthalate (PET), is preferable from the viewpoint of producing a thin, light and flexible photovoltaic cell.

Examples of the metal include aluminum, copper, gold, and the like.

The thickness of the substrate 1 is appropriately set according to the physical properties of the material used. For example, the substrate 1 may be a glass substrate having a thickness of 1 mm to 10 mm, a resin film having a thickness of 0.01 mm to 3 mm, or a metal foil having a thickness of 0.01 mm to 3 mm.

[First Conductive Layer 2]

Examples of the conductive material constituting the first conductive layer 2 include a metal, a metal oxide, a conductive polymer, a conductive carbon material, and the like. For obtaining a first conductive layer 2 which is transparent and allows light to transmit therethrough to the electric power generation layer 4, it is preferable that the first conductive layer 2 is made of a transparent conductive material. For example, the first conductive layer 2 is preferably a transparent conductive layer of a metal oxide.

As the metal oxide, a compound used for a transparent conductive layer of a conventional photovoltaic cell is applicable, and examples thereof include tin-doped indium oxide (ITO), fluorine-doped tin oxide (FTO), zinc oxide, tin oxide, antimony-doped tin oxide (ATO), indium oxide/zinc oxide (IZO), gallium oxide/zinc oxide (GZO), and the like. The metal oxide may be of one type or of two or more types.

The number of layers of the first conductive layer 2 may be one or two or more. The thickness of the first conductive layer 2 is not particularly limited as long as a desired conductivity can be obtained. For example, the thickness may be about 1 nm to 10 μm.

[Blocking Layer 3]

The blocking layer 3 is not essential, but it is preferable that the blocking layer 3 is disposed between the first conductive layer 2 and the electric power generation layer 4. When the blocking layer 3 is disposed, direct contact between the first conductive layer 2 and the perovskite compound of the electric power generation layer 4 is prevented. This prevents loss of electromotive force and improves photoelectric conversion efficiency.

In order to surely prevent the above contact, the blocking layer 3 is preferably a nonporous dense layer, and more preferably a dense layer formed of an N-type semiconductor.

The N-type semiconductor constituting the blocking layer 3 is not particularly limited, and examples thereof include oxide semiconductors having excellent electron conductivity, such as ZnO, $TiO_2$, SnO, IGZO, and $SrTiO_3$. In particular, $TiO_2$ is preferable because of its excellent electron conductivity.

The blocking layer 3 may be formed of one type of the N-type semiconductor or two or more types of N-type semiconductors.

The number of layers of the blocking layer 3 may be one or two or more.

The total thickness of the blocking layer 3 is not particularly limited, and may be, for example, about 1 nm to 1 μm. When the thickness is 1 nm or more, the above loss can be sufficiently prevented, and when the thickness is 1 μm or less, the internal resistance can be suppressed low.

[Electric Power Generation Layer 4]

From the viewpoint of enhancing the photoelectric conversion efficiency, the electric power generation layer 4 preferably has a laminate structure in which an upper layer formed of a perovskite compound is laminated on the surface of a base layer which is formed by an N-type semiconductor or an insulator and contains a perovskite compound. Alternatively, the electric power generation layer 4 may be composed only of the base layer, or may be composed only of the upper layer.

(Base Layer)

The base layer is laminated on the surface of the first conductive layer 2 or the blocking layer 3. The perovskite compound is supported on at least one of the inside and the surface of the base layer.

The material of the base layer is preferably an N-type semiconductor and/or an insulator.

The base layer may be a porous film or a nonporous dense film, and is preferably a porous film. It is preferable that the perovskite compound is supported by the porous structure of the base layer. Even when the base layer is a dense film, it is preferable that the perovskite compound is contained in the dense film. It is preferable that the dense film is formed of an N-type semiconductor.

The type of the N-type semiconductor is not particularly limited, and a known N-type semiconductor can be used. For example, oxide semiconductors used for forming photoelectrodes of the conventional dye-sensitized photovoltaic cells can be used. Specific examples of the oxide semiconductors include those having excellent electron conductivity, such as titanium oxide ($TiO_2$), zinc oxide (ZnO), tin oxide (SnO, SnO2), IGZO (semiconductor that is an oxide of indium (In), gallium (Ga) and zinc (Zn)), and strontium titanate (SrTiO3). Alternatively, compound semiconductors containing Si, Cd, ZnS, etc., which are doped with pentavalent elements, may also be used. Of these, titanium oxide is particularly preferable because of its excellent electron conductivity.

The N-type semiconductor constituting the base layer 3 may be of one type or of two or more types.

The type of the insulator is not particularly limited, and a known insulator can be used. For example, oxides used for forming insulating layers of the conventional semiconductor devices can be used. Specific examples of the oxides include zirconium dioxide, silicon dioxide, aluminum oxide (AlO, $Al_2O_3$), magnesium oxide (MgO), and nickel oxide (NiO). Of these, aluminum oxide (III) ($Al_2O_3$) is particularly preferable.

The insulator constituting the base layer may be of one type or of two or more types.

The amount of the perovskite compound contained in the base layer is not particularly limited, and is appropriately set so as to absorb light in an amount necessary for photoelectric conversion. For example, the amount of the perovskite compound is preferably 5 to 90% by volume with respect to the total volume of the base layer. Usually, as the amount of the perovskite compound increases, the amount of light that can be absorbed increases.

The film structure of the base layer is preferably a porous film into which a larger amount of the perovskite compound can be easily loaded. The larger the amount of the perovskite compound contained in the base layer, the higher the light absorption efficiency, and the photoelectric conversion efficiency can be further improved.

The average pore size of the porous film constituting the base layer is preferably 1 nm to 100 nm, more preferably 5 nm to 80 nm, and still more preferably 10 nm to 50 nm.

When the average pore size is not less than the lower limit of the above range, sufficient amount of the perovskite compound can be loaded into the pores.

When the average pore size is not more than the upper limit of the above range, the strength of the porous film is further enhanced.

The average pore size can be measured by a known gas adsorption test or mercury porosimetry test.

The thickness of the base layer is not particularly limited, and is, for example, preferably 10 nm to 10 μm, more preferably 50 nm to 1 μm, and still more preferably 100 nm to 0.5 μm.

When the thickness is not less than the lower limit of the above range, the base layer becomes a suitable scaffold for crystallization during the formation of the perovskite compound constituting the upper layer. Furthermore, the light absorption efficiency in the base layer is increased, and a further improved photoelectric conversion efficiency can be obtained.

When the thickness is not more than the upper limit of the above range, the efficiency of photoelectrons generated in the electric power generation layer 4 to reach the first conductive layer 2 via the base layer is increased, and a further improved photoelectric conversion efficiency can be obtained.

<Upper Layer>

The upper layer laminated on the surface of the base layer is formed of a perovskite compound. When the perovskite compound is supported inside the base layer, the upper layer may be omitted. When the upper layer is laminated, the total amount of the perovskite compound contained in the electric power generation layer 4 is increased, and the photoelectric conversion efficiency is further enhanced.

The thickness of the upper layer is not particularly limited, and is preferably 1 nm to 1 μm, more preferably 1 nm to 500 nm, and still more preferably 10 nm to 500 nm.

When the thickness is not less than the lower limit of the above range, the amount of light absorption increases and the photoelectric conversion efficiency can be further enhanced.

When the thickness is not more than the upper limit of the above range, the internal resistance can be reduced. Further, the upper layer is sufficiently adhered to the base layer and the P-type semiconductor layer 5, and peeling is prevented.

(Perovskite Compound)

The perovskite compound contained in the electric power generation layer 4 is not particularly limited as long as it can generate an electromotive force by light absorption, and a known perovskite compound can be used. Specifically, the perovskite compound has a perovskite crystal structure and has an organic component and an inorganic component in a single compound, and is a perovskite compound represented by the following composition formula (I):

$$ABX_3 \tag{I}$$

In the formula (1), A represents an organic cation, B represents a metal cation, and X represents a halide anion. In the perovskite crystal structure, the B sites can take an octahedral configuration in cooperation with the X sites. It is considered that mixing of atomic orbitals occurs between the metal cations of the B sites and the halide anions of the X sites so as to form a valence band and a conduction band related to photoelectric conversion.

The metal (cations) represented by B in the composition formula (I) is not particularly limited, and examples thereof include Cu, Ni, Mn, Fe, Co, Pd, Ge, Sn, Pb, and Eu. Among these, Pb and Sn are preferable, which can easily form a band with high conductivity by atomic orbital mixing with the halide anions at the X sites.

The metal cations at the B sites may be of one species or of two or more species.

The halogen (halide anions) represented by X in the composition formula (I) is not particularly limited, and examples thereof include F, Cl, Br, and I. Among these, Cl, Br and I are preferable, which can easily form a band with high conductivity by atomic orbital mixing with the metal cations at the B sites.

The halide anions at the X sites may be of one species or of two or more species.

The organic group (organic cation) represented by A in the composition formula (I) is not particularly limited, and examples thereof include an alkylammonium derivative and a formamidinium derivative.

The organic cations at the A site may be of one species or of two or more species.

Examples of the alkylammonium derivative as the organic cation include primary or secondary ammonium having an alkyl group having 1 to 6 carbon atoms, such as methylammonium, dimethylammonium, trimethylammonium, ethylammonium, propylammonium, isopropylammonium, tert-butylammonium, pentylammonium, hexylammonium, octylammonium, and phenyl ammonium. Among these, methylammonium is preferred since perovskite crystals can be easily obtained.

Examples of the formamidinium derivative as the organic cation include formamidinium, methylformamidinium, dimethylformamidinium, trimethylformamidinium, and tetramethylformamidinium. Among these, formamidinium is preferable since perovskite crystals can be easily obtained.

Suitable examples of the perovskite compound represented by the composition formula (1) include alkylammonium lead halides represented by the following composition formula (I-1):

$$RNH_3PbX_3 \tag{I-1}$$

Specific examples of the alkylammonium lead halides represented by the composition formula (I-1) include $CH_3NH_3PbI_3$, $CH_3NH_3PbI_{3-h}Cl_h$ (h is an integer of 0 to 3), and $CH_3NH_3PbI_{3-j}Br_j$ (j is an integer of 0 to 3).

In the composition formula (I-1), R represents an alkyl group, and X represents a halide anion. The perovskite compound of this composition formula has a wide absorption wavelength range and, hence, can absorb sunlight over a wide wavelength range, so that excellent photoelectric conversion efficiency can be attained.

The alkyl group represented by R in the composition formula (I-1) is preferably a linear, branched or cyclic and saturated or unsaturated alkyl group having 1 to 6 carbon atoms, more preferably a linear saturated alkyl group having 1 to 6 carbon atoms, and still more preferably a methyl group, an ethyl group or an n-propyl group. With these suitable alkyl groups, perovskite crystals can be easily obtained.

(Compound Z)

The electric power generation layer 4 contains a perovskite compound and a compound Z. In the structure of the electric power generation layer 4, it is preferable that the perovskite compound and the compound Z coexist. That is, it is preferable that the compound Z is contained together with the perovskite compound in both the base layer and the upper layer.

The compound Z is a compound having no perovskite structure, and the elements constituting the compound Z are in chemical states different from the elements constituting the perovskite compound.

Here, the term "chemical states" is synonymous with the bonding state of the elements constituting the compound.

The chemical states of the elements constituting the compound Z contained in the electric power generation layer 4 can be measured, for example, by photoelectron spectroscopy (XPS). Generally, since the electronic state (electron energy) in an element changes (undergoes chemical shift) depending on the bonding state, it is possible to investigate the chemical state of the compound contained in the measurement subject by analyzing the electron energy of each element by XPS. The binding energy of an element varies depending on the state of bonding with the adjacent atom and the valence of the atom. For example, it is possible to detect signals that can distinguish C—O bonds and C═O bonds, respectively. Also, for example, signals capable of distinguishing carbon atoms belonging to the respective structures can be detected based on a difference in electronegativity of elements bonded to the carbon atoms.

Therefore, the signal α derived from the chemical state of the elements constituting the perovskite compound is detected in the signals obtained by measuring the electric power generation layer 4 with XPS. Further, when the compound Z is contained in the electric power generation layer 4, a signal β different from this signal α is detected. That is, the detection of signal β shows that the electric power generation layer 4 contains the compound Z having a chemical state not possessed by the perovskite compound.

In the electric power generation layer 4 containing the compound Z, pin holes and cracks are unlikely to occur, and stable electric power generation performance is exhibited. The mechanism underlying this effect is considered that the compound Z stabilizes the crystallization process during the course of formation of the electric power generation layer (so-called perovskite layer), which proceeds as the formation of the perovskite crystal structure advances while the coating film of the raw material solution containing the raw materials of the perovskite compound gradually dries. That is, conventionally, since the crystallization rate at the time of forming the perovskite structure is rapid, vacant spaces are formed between crystal grain interfaces in the electric power generation layer 4 after drying, which is considered to be the cause of pinholes. Further, it is considered that uneven drying occurs at a plurality of portions of the coating film where the perovskite crystal structure is being formed, and the previously crystallized region is pulled or pushed by the later crystallized region to create locally dense and sparse regions, which cause pinholes and cracks. Such a problem is likely to arise especially when the substrate is flexible with a thickness of about 0.01 mm to 3 mm because the heat treatment for drying results in difference in the degree of thermal expansion between the substrate and the perovskite crystal.

On the other hand, when the compound Z is present at the time of crystallization in the formation of the perovskite compound, the speed of drying and/or crystallization becomes mild, which is considered to ameliorate the unevenness of drying and facilitate the perovskite crystal layer to be formed uniformly over the entire coating surface. Further, it is also conceivable that the formed perovskite crystal layer is stabilized by the compound Z, whereby the perovskite crystal layer has improved resistance to physical stress, heat, light, etc.

The compound Z exhibiting the above effect is preferably contained in the electric power generation layer 4 at least until drying of the raw material solution and crystallization at the time of formation of the perovskite structure are completed, and more preferably contained in the electric power generation layer 4 even after the crystallization is completed from the viewpoint of stabilization of the crystals. From this point of view, the boiling point of the compound Z is preferably higher than the boiling point of the solvent constituting the raw material solution, specifically, for example, the boiling point is preferably 150° C. or higher, more preferably 170° C. or higher, further preferably 200° C. or higher. By using the compound Z having a higher boiling point than that of the solvent of the raw material solution as described above, the compound Z can be easily caused to be contained in the electric power generation layer 4 after completion of crystallization.

For obtaining the above-mentioned effect, preferred examples of compound Z are as follows.

The compound Z is preferably an organic compound.

The compound Z preferably contains two or more elements z belonging to Groups 14 to 16 of the periodic table. The elements z are preferably two or more elements selected from the group consisting of carbon, nitrogen, oxygen, silicon, phosphorus, and sulfur. Suitable combinations thereof include, for example, carbon-nitrogen, carbon-oxygen, carbon-phosphorus, and carbon-sulfur.

The compound Z is preferably an organic compound having at least one of an alkyl group, an alkenyl group and an alkynyl group. These organic groups are linear or branched, and the number of carbon atoms thereof is preferably 1 to 6.

In order to homogeneously stabilize the crystals of the perovskite compound throughout the electric power generation layer 4 and achieve a good film quality, it is more preferable that the affinity between the compound Z and the perovskite compound is high. Generally, as the degrees of polarity of the two compounds are closer, the affinity tends to be higher. Usually, the perovskite compound is an ionic crystal and has high polarity. Therefore, it is more preferable that the compound Z also has polarity.

From this point of view, when a single compound Z has two or more of the above elements z which include a first element z having a highest electronegativity and a second element z having a lowest electronegativity among the elements z, it is preferable that a difference in electronegativity between the first element z and the second element z is 0.1 or more. For example, a combination of carbon and oxygen, a combination of carbon and nitrogen, a combination of carbon and phosphorus, and a combination of sulfur and oxygen can be mentioned. In the compound Z having two or more elements z with different electronegativities, the electron density is biased and appropriate polarity is created. This increases the affinity between the perovskite compound and the compound Z, whereby a good film quality can be achieved. In the present specification, the term "electronegativity" means Pauling electronegativity.

From the viewpoint of ensuring an appropriately high polarity, it is preferable that the two or more elements z having different electronegativities are bonded to each other. When compound Z has two or more bonds having such polarity, it is preferable that such bonds are in a three-dimensional arrangement such that the bonds do not cancel each other's polarity.

The compound Z preferably has at least one group selected from an ether group (—O—), a hydroxyl group (—OH), a carbonyl group (>C═O), a sulfo group (—SO$_3$H), a thiol group (—SH), a sulfenyl group (R$^1$S—; R$^1$ is a monovalent organic group), a sulfonyl group (—S(═O)$_2$—), a sulfite group (R$^1$O—S(═O)—O—; R$^1$ is a monovalent organic group), a phosphine group (>P—), a phosphono group {(R$_1$O)$^2$P(═O)—; each R$^1$ independently represents a monovalent organic group}, and a R$^1$O— group (R$^1$ is a monovalent organic group).

Among the above groups, the monovalent organic group represented by R$^1$ is preferably a linear or branched alkyl group or alkenyl group, and the number of carbon atoms thereof is preferably 1 to 6.

Specific examples of the compound Z include the compounds (Z1) to (Z4) represented by the following formulae (Z1) to (Z6).

<Compound (Z1): Hydrocarbon Compound>

$$R^5-(CH_2)_n-R^6 \quad (Z1)$$

In the formula (Z1), n represents an integer of 4 to 20, each of $R^5$ and $R^6$ independently represents a hydrogen atom, a —SH group or a —OH group, or $R^5$ and $R^6$ are bonded to each other as a single bond to form a cyclic structure, at least one pair of adjacent (—$CH_2$—) groups may be bonded with an unsaturated double bond to form a vinylene group (—CH=CH—), at least a part of (—$CH_2$—) group may be substituted with a vinyl group or the like, and a hydrogen atom of at least one of non-adjacent (—$CH_2$—) groups may be substituted with a —OH group.

In the formula (Z1), it is preferable that at least one of $R^5$ and $R^6$ is an —SH group or an —OH group.

In the formula (Z1), n is preferably from 6 to 18, more preferably from 7 to 16, and still more preferably from 8 to 14.

Preferred specific examples of the compound (Z1) include n-decane (boiling point 174° C.), n-dodecane (boiling point 216° C.), 2-decanol (boiling point 211° C.), 2-butanethiol (boiling point 84° C.), 1-heptanethiol (boiling point 177° C.), 1-decanethiol (boiling point 241° C.), and the like. Among these, 2-decanol, 1-heptanethiol, and 1-decanethiol are more preferable.

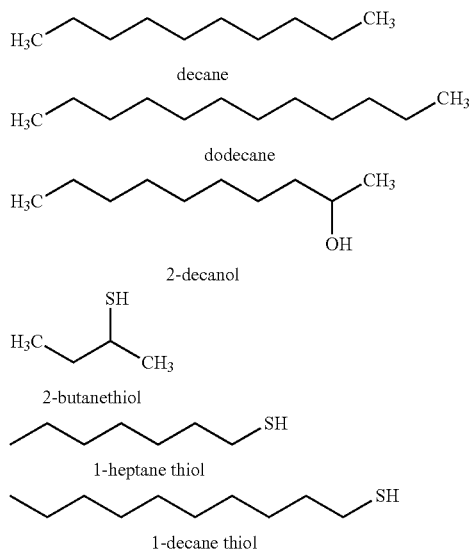

When the compound represented by the formula (Z1) is a polymerizable compound such as styrene, the compound (Z1) may be a polymer such as polystyrene.

<Compound (Z2): Nitrogen-Containing Compound>

$$*-(CH_2)_{n1}-NH-(CH_2)_{n2}-* \quad (Z2)$$

In the formula (Z2), "*" at both ends form a single bond to form a cyclic group, n1 and n2 each represents an integer of 1 to 3, and at least one of non-adjacent (—$CH_2$—) groups may each independently be substituted with a (>C=O) group, the hydrogen atom of (—NH—) may be substituted with an alkyl group having 1 to 3 carbon atoms.

In the formula (Z2), it is preferable that n1 and n2 are each independently 2 or 3, and n1+n2 is 4 or 5.

Preferred specific examples of the compound (Z2) include n-methylpyrrolidone (boiling point 202° C.), N-methyl succinimide (boiling point 235° C.), and the like, which are shown by the structural formulae below.

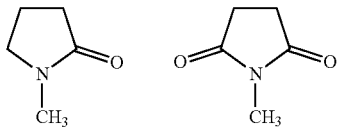

N-methylpyrrolidone   N-methylsuccineimide

<Compound (Z3): Phosphorus Compound>

$$R^7-(R^8-)(R^9-)P(=O)_n \quad (Z3)$$

In the formula (Z3), n is 0 or 1, each of $R^7$, $R^8$ and $R^9$ is independently a linear or branched alkyl group having 1 to 8 carbon atoms, which is bonded to a phosphorus atom, and at least one of non-adjacent (—$CH_2$—) groups constituting the alkyl group may be substituted with a (—O—) group.

Preferable specific examples of the compound (Z3) include tributylphosphine (boiling point 240° C.), triethyl phosphate (boiling point 216° C.), and the like, which are shown by the structural formula below.

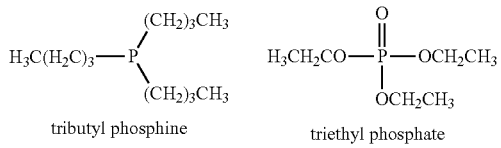

tributyl phosphine   triethyl phosphate

<Compound (Z4): Sulfur-Containing Compound>

$$R^{10}-S(=O)_n-R^{11} \quad (Z4)$$

In the formula (Z4), n is 1 or 2, and each of $R^{10}$ and $R^{11}$ independently represents a monovalent organic group bonded to a sulfur atom, a monovalent halogenated organic group, or a halogen atom, $R^{10}$ and $R^{11}$ may be bonded to each other to form a cyclic structure, and at least one of non-adjacent (—$CH_2$—) groups constituting the organic group may be substituted with a (—O—) group.

Examples of the organic group include a linear or branched alkyl group or alkoxy group having 1 to 15 carbon atoms, a linear or branched halogenated alkyl group or halogenated alkoxy group having 1 to 15 carbon atoms, an aryl group or aryloxy group having 6 to 15 carbon atoms, a halogenated aryl group or halogenated aryloxy group having 6 to 15 carbon atoms, and a residue of a polymerizable monomer described later.

Further, in the formula (Z4), it is preferable that n is 2, and/or at least one of $R^{10}$ and $R^{11}$ is the above-mentioned alkoxy group, halogenated alkoxy group, aryloxy group or halogenated aryloxy group.

Preferred specific examples of the compound (Z4) include dimethylsulfoxide (DMSO, boiling point 189° C.), dimethyl sulfone (boiling point 238° C.), ethyl methyl sulfone (boiling point 239° C.), diphenyl sulfone (boiling point 379° C.), 4-benzyloxyphenyl 4-hydroxyphenylsulfone (melting point 170° C.), polysulfone, diisopropyl sulfite (boiling point 170° C.), tetrahydrothiophene 1-oxide (boiling point 235° C.) and the like.

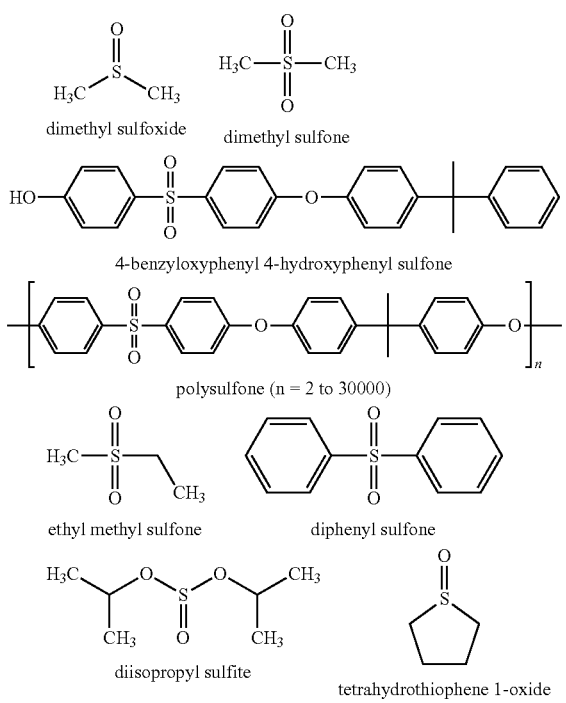

A preferable example of the further compound (Z4) is a sulfate such as dimethyl sulfate (boiling point 188° C.) represented by the following formula.

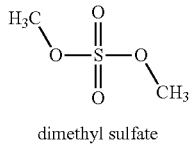

dimethyl sulfate

Further, when n in the formula (Z4) is 2, that is, when the compound (Z4) has a sulfonyl group, —S(=O)$_n$—R$^7$ may be a bissulfonylimide residue. That is, —S(=O)$_n$—R$^7$ may be a group having a structure represented by the following formula (1).

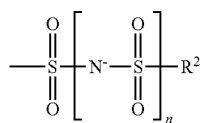

(1)

wherein R$^2$ is an alkyl group having 1 to 15 carbon atoms, a halogenated alkyl group having 1 to 15 carbon atoms, an aryl group having 6 to 15 carbon atoms, a halogenated aryl group having 6 to 15 carbon atoms, or a halogen atom, and n is 0 or 1.

Here, when n is 1, that is, when the group represented by the formula (2) is a bissulfonylimide residue, it is preferable that this group forms a salt with an alkali metal such as ammonium, Li or Na, an alkaline earth metal such as Mg or Ca, a transition metal such as Ag, or the like.

The alkyl group (including the alkyl group in the halogenated alkyl group) is preferably a linear, branched or cyclic and saturated or unsaturated alkyl group, more preferably a linear saturated alkyl group having 1 to 6 carbon atoms, and still more preferably a methyl group, an ethyl group or an n-propyl group. With these suitable alkyl groups, perovskite crystals can be easily obtained.

Examples of the aryl group (including the aryl group in the halogenated aryl group) include a phenyl group and a naphthyl group, and a phenyl group is preferable. With these preferable aryl groups, perovskite crystals can be easily obtained.

The halogen atom (including the halogen atom in the halogenated alkyl group and the halogenated aryl group) is a fluorine atom, a chlorine atom, a bromine atom, or an iodine atom. Among these, a fluorine atom or a chlorine atom which has a high electronegativity is preferable from the viewpoint of the polarity described above. That is, the halogenated alkyl group is preferably a fluoroalkyl group or a chloroalkyl group, and the halogenated aryl group is preferably a fluoroaryl group or a chloroaryl group.

Specific examples of the fluoroalkyl group as R$^2$ include a fluoromethyl group, a difluoromethyl group, a trifluoromethyl group, a 2-fluoroethyl group, a 2,2-difluoroethyl group, a 2,2,2-trifluoroethyl group, a pentafluoroethyl group, a 3,3,3-trifluoropropyl group, a perfluoro n-propyl group, a perfluoroisopropyl group, a 3,3,4,4,4-pentafluorobutyl group, a perfluoro n-butyl group, a perfluoroisobutyl group, a perfluoro t-butyl group, a perfluoro n-pentyl group, a perfluoroisopentyl group, a perfluoro t-pentyl group, a perfluoro n-hexyl group, a parfluoroisohexyl group and the like. Among these, a perfluoroalkyl group is preferable, and a trifluoromethyl group, a pentafluoroethyl group, and a perfluoro n-propyl group are more preferable.

Specific examples of the chloroalkyl group as R$^2$ include a chloromethyl group, a dichloromethyl group, a trichloromethyl group, a 2-chloroethyl group, a 2,2-dichloroethyl group, 2,2,2-trichloroethyl group, pentachloroethyl group, 3,3,3-trichloropropyl group, a perfluoro-n-propyl group, perchloroisopropyl group, a 3,3,4,4,4-pentachlorobutyl group, perchloro n-butyl group, a perchloroisobutyl group, a perchloro-t-butyl group, a perchloro-n-pentyl group, a perchloroisopentyl group, a perchloro-t-pentyl group, a perchloro-n-hexyl group and a perchloroisohexyl group. Among these, a perchloroalkyl group is preferable, and a trichloromethyl group, a pentachloroethyl group, and a perchloro-n-propyl group are more preferable.

Specific examples of the fluoroaryl group as R$^2$ include a 4-fluorophenyl group, a 3,4-difluorophenyl group, a 2-chlorophenyl group, a perfluorophenyl group and the like. Among these, a perfluorophenyl group is more preferable.

Specific examples of the chloroaryl group as R$^2$ include a 4-chlorophenyl group, a 3,4-dichlorophenyl group, a 2-chlorophenyl group, a perchlorophenyl group and the like. Among these, a perchlorophenyl group is more preferable.

R$^{10}$ in the formula (Z4) is a residue of a polymerizable monomer, and the polymerizable monomers may be bonded to each other to form an oligomer or a polymer. Examples of such polymerizable monomers include α-olefins having 2 to 20 carbon atoms such as ethylene, propylene, 1-butene, 1-pentene and 1-hexene; unsaturated carboxylic acids such as acrylic acid and methacrylic acid; unsaturated carboxylic acid esters such as (meth)acrylic acid ester (e.g., methyl acrylate, ethyl acrylate, butyl acrylate, 2-ethylhexyl acrylate, octyl acrylate, 2-hydroxyethyl acrylate, 2-hydroxypropyl acrylate, methyl methacrylate, and butyl methacrylate) and vinyl acetate; acrylic compounds such as acrylonitrile and acrylamide; and aromatic vinyl compounds such as styrene, α-methylstyrene, vinyltoluene and divinylbenzene.

For example, as an example of the compound Z in which $R^{10}$ in the formula (Z4) is ethylene, an ethylene polymer having repeating units represented by the following formula (Z4-1) can be mentioned.

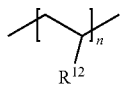
(Z4-1]

wherein each $R^{12}$ is independently a group represented by the above formula (1), and n is an integer of 2 to 30,000).

When the compound Z is an ethylene polymer containing repeating units represented by the above formula (Z4-1), the $R^{12}$ groups may be the same or different. Alternatively, the compound Z may be a copolymer having repeating units with $R^{12}$ and repeating units without $R^{12}$. The repeating unit without $R^{12}$ may be an ethylene monomer unit or a monomer unit other than an ethylene monomer unit.

When the ethylene polymer is a copolymer, the ratio of the repeating unit with $R^{12}$ in the whole copolymer is preferably 1 mol % to 90 mol %, more preferably 5 mol % to 80 mol %, and particularly preferably from 10 mol % to 70 mol %. When this ratio is not less than the above lower limit value, the above effect of the compound Z can be surely obtained. Further, when the ratio is not more than the above upper limit value, the steric hindrance due to $R^{12}$ can be moderately reduced, thereby enabling the compound Z to exhibit sufficient compatibility with the perovskite compound.

Specific examples of the ethylene polymer include a polymer containing repeating units represented by the following formula (Z4-2) (hereinafter referred to as "PETFSI").

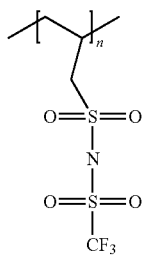
(Z4-2)

Examples of the compound Z with $R^{10}$ in the formula (Z4) being styrene include a styrene monomer having a structure represented by the following formula (Z4-3), and at least one styrenic compound selected from styrene polymers having repeating units represented by the following formula (2), which are obtained by polymerizing styrene monomers including the styrene monomer mentioned above.

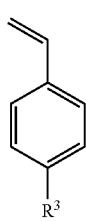
(Z4-3)

wherein $R^3$ is a group represented by the above formula (1).

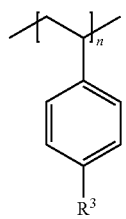
(2)

wherein each $R^3$ is independently a group represented by the formula (1) or a hydrogen atom, and at least one of multiple groups $R^3$ is a group represented by the formula (1), and n is an integer from 2 to 30,000.

When the compound Z is a styrene polymer containing repeating units represented by the above formula (2), the $R^3$ groups may be the same or different. Alternatively, the compound Z may be a copolymer having repeating units with $R^3$ and repeating units without $R^3$. The repeating unit without $R^3$ may be a styrene monomer unit or a monomer unit other than a styrene monomer unit.

When the styrene polymer is a copolymer, the ratio of the repeating unit with $R^3$ in the whole copolymer is preferably 1 mol % to 90 mol %, more preferably 5 mol % to 80 mol %, and particularly preferably from 10 mol % to 70 mol %. When this ratio is not less than the above lower limit value, the above effect of the compound Z can be surely obtained. Further, when the ratio is not more than the above upper limit value, the steric hindrance due to $R^3$ can be moderately reduced, thereby enabling the compound Z to exhibit sufficient compatibility with the perovskite compound.

Specific examples of the styrene monomer include those represented by the following formula (Z4-4) (hereinafter referred to as "TFSI"). Specific examples of the styrene polymer include a polymer containing repeating units represented by the following formula (Z4-5) (hereinafter referred to as "TFSI-1"), a polymer containing repeating units represented by the following formula (Z4-6) (hereinafter referred to as "TFSI-2"), and a polymer containing repeating units represented by the following formula (Z4-7) (hereinafter referred to as "TCSI").

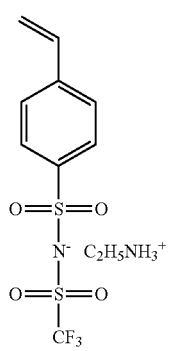
(Z4-4)

-continued

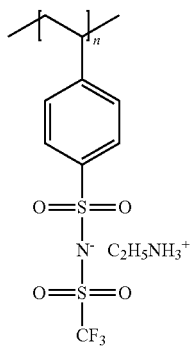
(Z4-5)

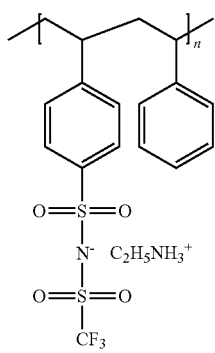
(Z4-6)

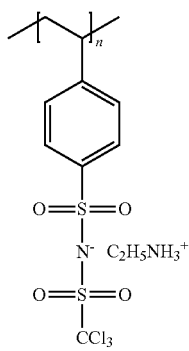
(Z4-7)

For example, as an example of the compound Z in which $R^{10}$ in the formula (Z4) is methyl methacrylate, an acrylic polymer having repeating units represented by the following formula (Z4-8) can be mentioned.

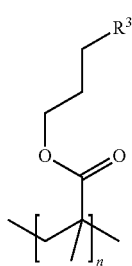
(Z4-8)

wherein each $R^3$ is as defined above, and n is an integer of 2 to 30,000.

When the compound Z is an acrylic polymer containing repeating units represented by the above formula (4), the $R^3$ groups may be the same or different. Alternatively, the compound Z may be a copolymer having repeating units with $R^3$ and repeating units without $R^3$. The repeating unit without $R^3$ may be a methyl methacrylate monomer unit or a monomer unit other than a methyl methacrylate monomer unit.

When the acrylic polymer is a copolymer, the ratio of the repeating unit with $R^3$ in the whole copolymer is preferably 1 mol % to 90 mol %, more preferably 5 mol % to 80 mol %, and particularly preferably from 10 mol % to 70 mol %. When this ratio is not less than the above lower limit value, the above effect of the compound Z can be surely obtained. Further, when the ratio is not more than the above upper limit value, the steric hindrance due to $R^3$ can be moderately reduced, thereby enabling the compound Z to exhibit sufficient compatibility with the perovskite compound.

Specific examples of the acrylic polymer include a polymer containing repeating units represented by the following formula (Z4-9) (hereinafter referred to as "PMMATFSI").

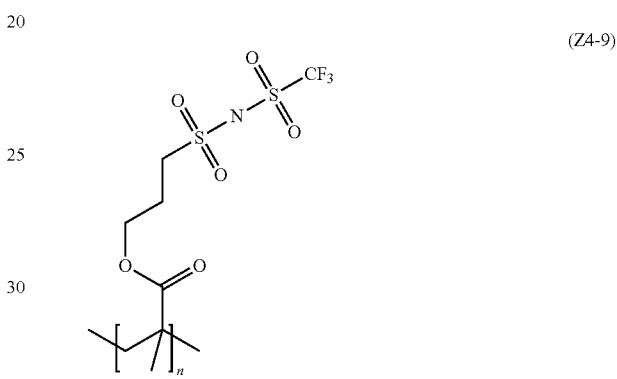
(Z4-9)

wherein n is an integer of 2 to 30,000.

<Compound (Z5): Carbonyl Group-Containing Compound>

$$R^{12}\text{—CO—}R^{13} \tag{Z5}$$

In the formula (Z5), $R^{12}$ is a saturated or unsaturated hydrocarbon group having 1 to 15 carbon atoms, and $R^{13}$ is a group selected from a hydroxyl group, an alkoxy group and an amino group.

Examples of the saturated hydrocarbon group include linear or branched alkyl groups such as a methyl group, an ethyl group, a n-propyl group, an isopropyl group, a n-butyl group, an isobutyl group, a sec-butyl group, a tert-butyl group, a pentyl group, a hexyl group, a heptyl group, an octyl group, a nonyl group and a decyl group; and cycloalkyl groups such as cyclopentyl group, a cyclohexyl group, a cycloheptyl group and a cyclooctyl group.

Examples of the unsaturated hydrocarbon group include an alkenyl group having 2 to 8 carbon atoms such as a vinyl group, a propenyl group, a butenyl group, and a pentenyl group.

Among these, from the viewpoint of commercial availability and the like, it is preferable that $R^{12}$ is a vinyl group.

Further, the saturated or unsaturated hydrocarbon group as $R^{12}$ may be a halogen-substituted group. Examples of the halogen-substituted saturated or unsaturated hydrocarbon group (hereinafter sometimes simply referred to as "halogenated hydrocarbon group") include the halogenated alkyl group and the halogenated aryl group mentioned above as examples of $R^2$ in the above formula (1).

When $R^{12}$ is a vinyl group, multiple compounds of the formula (Z5) may be bonded (polymerized) to form a polymer. Examples of the compound (Z5) being such a polymer include a (meth)acrylate resin such as polymethyl-methacrylate (PMMA), and an acrylamide resin.

Further, it is preferable that $R^{12}$ present in such a polymer is substituted with the halogenated hydrocarbon group described above. As a specific example, a polymer containing repeating units represented by the following formula (Z5-1) (hereinafter referred to as "TFPMMA") can be mentioned.

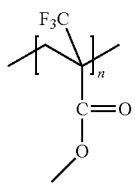
(Z5-1)

wherein n is an integer of 2 to 30,000.

With respect to the range of n (degree of polymerization), the same applies to the case of PMMA or acrylamide resin which is not substituted with a halogenated hydrocarbon group.

<Compound (Z6): Ether Group-Containing Compound>

The compound (Z6) is not particularly limited as long as it is a compound having an ether group (ether bond, —O—).

Examples of the ether group-containing compound (Z6) include ethers such as diethyl ether, dibutyl ether, tetrahydrofuran, dioxane, tetrahydropyran, dioxolane, trioxane and the like. Further, cellulose and cellulose derivatives (hereinafter collectively referred to as "cellulose compound") are also included in the ether group-containing compound (Z6).

Here, the cellulose compound has a structure represented by the following formula (3).

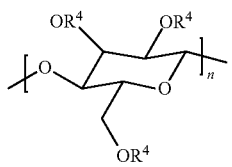
(3)

wherein each $R^4$ independently represents a hydrogen atom or a hydrocarbon group, and n is an integer of from 2 to 30000.

The hydrocarbon group is preferably an aliphatic hydrocarbon group, more preferably an alkyl group, and still more preferably an alkyl group having 1 to 4 carbon atoms (lower alkyl group). Specific examples thereof include a methyl group, an ethyl group, a propyl group, an isopropyl group, a butyl group, an isobutyl group, a pentyl group, a hexyl group, a heptyl group, a 2-ethylhexyl group, a tert-butyl group and an isoheptyl group. Among these, a methyl group and an ethyl group are preferable.

Specifics example of the case where $R^4$ in the cellulose compound is a hydrocarbon group (that is, when the cellulose compound is a cellulose derivative) include methyl cellulose having a structure represented by the following formula (Z6-1) and ethyl cellulose having a structure represented by the following formula (Z6-2).

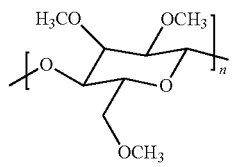
(Z6-1)

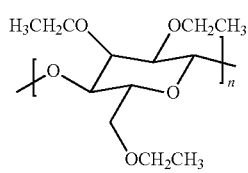
(Z6-2)

The maximum value of the electronegativity of the elements constituting the compound Z contained in the electric power generation layer 4 is preferably larger than the maximum value of electronegativity of the elements constituting the perovskite compound. Here, the term "electronegativity" means Pauling electronegativity.

For example, the electronegativities of the elements constituting the perovskite compound represented by the chemical formula of $CH_3NH_3PbI_3$ are as follows: carbon 2.55, hydrogen 2.20, nitrogen 3.04, lead 2.20, iodine 2.66. Therefore, the maximum value is 3.04 of nitrogen.

On the other hand, for example, the maximum electronegativity among the elements constituting the dimethylsulfone mentioned as an example of the compound (Z4) is 3.44 of the oxygen atom.

Accordingly, from the viewpoint of electronegativity as well, dimethylsulfone is a preferable compound Z.

It is considered that the use of the compound Z containing an element having a high electronegativity can favorably influence the crystallization at the time of formation of the perovskite compound.

The compound Z contained in the electric power generation layer 4 may be of one type or of two or more types.

The perovskite compound contained in the electric power generation layer 4 may be of one type or of two or more types.

The mass ratio of the total of the perovskite compound to the total of the compound Z, both contained in the electric power generation layer 4, is not particularly limited. For example, the number of moles of the compound Z with respect to 100 moles of the perovskite compound is preferably from 0.01 to 50, more preferably from 0.1 to 20, and still more preferably from 1 to 10. Incidentally, when the compound Z is a polymer, the molar amount of the compound Z is obtained in terms of the number of monomer units (repeating units) constituting the polymer. That is, assuming that one repeating unit is 1 mole, the number of moles of the compound Z being a polymer is calculated.

When the amount of the compound Z is 0.01 mol or more, the perovskite crystals can be further stabilized, and when the amount is 50 mol or less, a decrease in electric power generation performance by the perovskite crystals, that is, decrease in electromotive force per unit mass of the electric power generation layer 4, can be suppressed.

The molecular weight of the polymer as the compound Z is not particularly limited as long as the above effects of the compound Z can be obtained, and the molecular weight of the polymer varies depending on the type of the polymer; however, the number average molecular weight of the polymer is preferably 100 to 5000000, more preferably 100 to 1000000, and still more preferably 10000 to 500000. When the molecular weight is not less than the above lower limit value, there is an advantage that the phenomenon that the compound Z diffuses in the perovskite film under high temperature conditions or the like can be suppressed, and when the molecular weight is not more than the above upper limit value, the compound Z can be easily dissolved or dispersed in the raw material solution.

The number average molecular weight is a value determined by, for example, gel permeation chromatography (GPC) and calibration with polystyrene standards.

Any of the above-mentioned compounds Z can be produced by a known method or by a combination of known methods.

From the viewpoint of avoiding hindering light absorption and photoelectric conversion by the perovskite compound in the electric power generation layer 4, the molar absorptivity of the compound Z is preferably 1000 or less.

Unless otherwise specified in the present specification, the "molar absorptivity" means one measured at a wavelength of 400 to 800 nm.

With respect to the compound Z that has been described above, it is preferable that the compound Z is at least one compound selected from the group consisting of the following (i) to (v) among those described above:

(i) the hydrocarbon compound (Z1) represented by the above formula (Z1), wherein at least one of $R^5$ and $R^6$ is —SH group or —OH group, (ii) the phosphorus-containing compound (Z3) represented by the formula (Z3), (iii) the sulfur-containing compound (Z4) represented by the formula (Z4), wherein n is 2 and/or at least one of $R^{10}$ and $R^{11}$ is an alkoxy group, a halogenated alkoxy group, an aryloxy group or a halogenated aryloxy group which are as described above, (iv) the carbonyl group-containing compound (Z5) represented by the above formula (Z5), wherein the saturated or unsaturated hydrocarbon group as $R^{12}$ is halogen-substituted or $R^{13}$ is an amino group, and (v) the cellulose and the cellulose derivatives which are ether group-containing compounds (Z6).

More preferably, the compound Z is at least one compound selected from the group consisting of the compounds belonging to (iii), (iv) and (v).

All of the above compounds exhibit appropriate polarity, so that the compounds are suitable for obtaining the effects of the compound Z described above.

Further, the layer (i.e., perovskite film) containing the perovskite compound and the compound Z formed in the above-described manner can be applied not only to the electric power generation layer of the solid junction-type photoelectric conversion element but also to various other applications utilizing the characteristics of the perovskite structure, such as LED displays.

<P-Type Semiconductor Layer 5>

The P-type semiconductor layer 5 is not essential, but it is preferable that the P-type semiconductor layer 5 is disposed between the electric power generation layer 4 and the second conductive layer 6.

The P-type semiconductor layer 5 is made of a P-type semiconductor having holes, and suppresses the generation of a reverse current, while allowing holes generated in the electric power generation layer 4 by light absorption to be easily transferred to the second conductive layer 6. Furthermore, the efficiency with which electrons move from the second conductive layer 6 to the electric power generation layer 4 is enhanced. As a result, the photoelectric conversion efficiency and the voltage can be increased.

The type of the P-type semiconductor is not particularly limited, and may be an organic material or an inorganic material. For example, P-type semiconductors used in hole transport layers of known photovoltaic cells can be used. Examples of the organic material include 2,2', 7,7'-tetrakis (N,N-di-p-methoxyphenilamine)-9,9'-spirobifluorene (abbreviated as spiro-OMeTAD), poly(3-hexylthiophene) (abbreviated as P3HT), and polytriarylamine (abbreviated as PTAA).

Examples of the inorganic material include copper compounds such as CuI, CuSCN, CuO, $Cu_2O$ and nickel compounds such as NiO.

The P-type semiconductor layer 5 may be formed of one type of the P-type semiconductor or two or more types of P-type semiconductors.

The number of layers of the P-type semiconductor layer 5 may be one or two or more.

The thickness of the P-type semiconductor layer 5 is not particularly limited, and is preferably 1 nm to 1000 nm, more preferably 5 nm to 500 nm, and still more preferably 30 nm to 500 nm.

When the thickness is not less than the lower limit of the above range, it is possible to surely prevent contact between the electric power generation layer 4 and the second conductive layer 6 and to prevent occurrence of leakage current.

When the thickness is not more than the upper limit of the above range, the internal resistance can be further reduced.

<Second Conductive Layer 6>

The second conductive layer 6 constitutes a counter electrode. The first conductive layer 2, the blocking layer 3 and the electric power generation layer 4 constitute a photoelectrode.

The material of the second conductive layer is not particularly limited, and it is preferable to use, for example, at least one metal selected from the group consisting of gold, silver, copper, aluminum, tungsten, nickel and chromium. When the substrate 1 is a metal, it is preferable that the second conductive layer is the transparent conductive layer.

The number of layers of the second conductive layer 6 may be one or two or more. The thickness of the second conductive layer 6 is not particularly limited, and is preferably, for example, 10 nm to 100 nm.

<<Electric Power Generation by Photoelectric Conversion Element>>

When the crystals of the perovskite compound contained in the electric power generation layer 4 of the photoelectric conversion element 10 of FIG. 1 absorb light, photoelectrons and holes are generated in the crystals. The photoelectrons are received by the base layer or the blocking layer 3 and move to a working electrode (positive electrode) constituted by the first conductive layer 2. On the other hand, the holes move to the counter electrode (negative electrode) constituted by the second conductive layer 6 via the P-type semiconductor layer 5.

Figure 2:
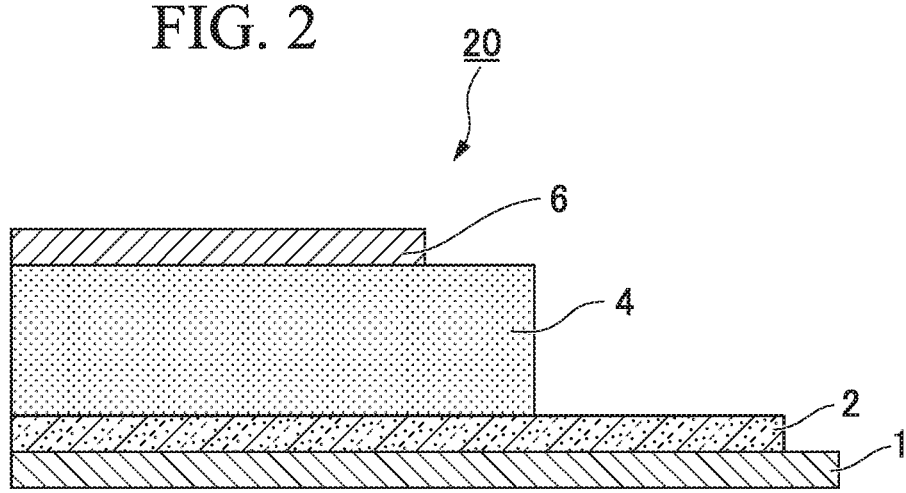
FIG. 2 is a cross-sectional view of a second embodiment of the solid junction-type photoelectric conversion element according to the present invention.

When the crystals of the perovskite compound contained in the electric power generation layer 4 of the photoelectric conversion element 20 of FIG. 2 absorb light, photoelectrons and holes are generated in the crystals. The photoelectrons move to a working electrode (positive electrode) constituted by the first conductive layer 2. On the other hand, the holes move to the counter electrode (negative electrode) constituted by the second conductive layer 6.

The current generated by the photoelectric conversion elements 10,20 can be taken out to the external circuit via the extraction electrodes connected to the positive electrode and the negative electrode.

<<Method for Producing Photoelectric Conversion Element>>

The solid junction-type photoelectric conversion element according to the present invention can be manufactured by the same manufacturing method as that of a conventional perovskite photovoltaic cell, except that the compound Z is added to a raw material solution containing raw materials of the perovskite compound. Hereinbelow, examples of respective methods of forming the layers will be described.

<Preparation of Substrate 1>

The substrate 1 can be produced by a conventional method, and a commercially available product may be used.

<Formation of First Conductive Layer 2>

The method of forming the first conductive layer 2 on the surface of the substrate 1 is not particularly limited, and examples thereof include known film forming methods such as a physical vapor deposition method and a printing method, which are used in forming a transparent conductive layer of a conventional photovoltaic cell.

<Formation of Blocking Layer 3>

The method of forming the blocking layer 3 is not particularly limited, and a known method capable of forming a dense layer made of an N-type semiconductor with a desired thickness on the surface of the first conductive layer 2 can be adopted. Examples of such method include a sputtering method, a vapor deposition method, and sol-gel method in which a dispersion containing a precursor of an N-type semiconductor is applied to a substrate.

Examples of the precursor of the N-type semiconductor include metal alkoxides, such as titanium tetrachloride ($TiCl_4$), peroxotitanic acid (PTA), and titanium alxodies (such as titanium ethoxide, and titanium isopropoxide (TTIP)), zinc alkoxides, alkoxysilanes, and zirconium alkoxides.

<Formation of Electric Power Generation Layer 4>

(Formation of Base Layer)

The method for forming the base layer is not particularly limited and, for example, a method used for forming a semiconductor layer carrying a sensitizing dye of a conventional dye-sensitized photovoltaic cell can be adopted.

Specifically, for example, a paste containing fine particles of an N-type semiconductor or an insulator and a binder is applied to the surface of the blocking layer 3 by a doctor blade method, followed by drying and baking to form a porous base layer composed of fine particles. Alternatively, by spraying the fine particles onto the surface of the blocking layer 3, it is possible to form a porous or non-porous base layer composed of the fine particles.

The method of spraying the fine particles is not particularly limited, and known methods can be employed. Examples of such methods include an aerosol deposition method (AD method), an electrostatic particle coating method (electrostatic spray method) where fine particles are accelerated by electrostatic force, and a cold spray method. Among these methods, the AD method is preferable because it is easy to adjust the speed of the sprayed fine particles, and the film quality and thickness of the base layer to be formed can be easily controlled.

The AD method is a method of accelerating the fine particles to a subsonic to supersonic speed with a carrier gas such as nitrogen and spraying it against a substrate to form a film made of the fine particles on the surface of the substrate. The continuously sprayed fine particles collide against the fine particles bonded to the surface of the substrate, whereby a film in which the fine particles are joined is formed. The collision between the fine particles is unlikely to increase the temperature to a level at which the fine particles melt. Further, since the formed porous film has sufficient strength and electron conductivity as an electrode of a photovoltaic cell, a calcination step after the film formation is not essential. However, calcination (sintering) may be carried out if necessary.

The AD method can form the base layer at room temperature; therefore, a synthetic resin film or the like having a glass transition temperature of less than 200° C. can be used as the substrate. Therefore, since a wider variety of substrates can be used as compared to a method requiring a high-temperature calcination process, it is possible to manufacture various types of photoelectric conversion elements applicable to a wide range of purposes and applications.

By suitably adjusting the speed of the fine particles to be sprayed, the film forming rate and the porosity of the film can be adjusted. Normally, as the spraying speed is increased, the film forming rate tends to increase, while the porosity of the film tends to decrease. Accordingly, when forming the base layer, the base layer can be formed while arbitrarily selecting whether the base layer should be a porous film or a dense film by adjusting the spraying speed of the fine particles.

One or more types of N-type semiconductor fine particles and one or more types of insulator fine particles may be used in combination as materials for forming the base layer.

The average particle diameter r of the fine particles is preferably $1\ nm \leq r < 200\ nm$, more preferably $10\ nm \leq r \leq 70\ nm$, and still more preferably $10\ nm \leq r \leq 30\ nm$.

As the average particle diameter increases within the above range, it becomes easier to sufficiently insert the perovskite compound into the pores constituting the porous structure of the base layer. As the average diameter decreases within the above range, the interface between the perovskite compound and the N-type semiconductor fine particle is increased, whereby it becomes easier to take out the photoelectrons, and the base layer and the P-type semiconductor layer 5 come into contact so as to prevent the loss of electromotive force.

The average particle diameter r of the fine particles can be determined as an average value of particle diameters measured by observing a plurality of fine particles with an electron microscope. In this case, it is preferable that the number of fine particles to be measured is as large as possible; for example, the diameters of 10 to 50 particles may be measured to determine the arithmetic mean thereof. Alternatively, the average particle diameter can be determined as a peak value of a particle diameter (volume average diameter) distribution obtained by measurement with a laser diffraction type particle size distribution measuring apparatus. When the measurement sample of the same fine particle is measured by the above two types of methods and the measured values are different from each other, the value obtained by observation with an electron microscope is used to judge whether or not the measured value is within the above range of the average particle diameter.

The method for allowing the perovskite compound to be contained in the base layer is not particularly limited, and examples thereof include a method of impregnating the formed base layer with a solution containing raw materials or a precursor of the perovskite compound, and a method of using a material to which a perovskite compound has been attached in advance to form the base layer. The above two methods may be used in combination.

In the case of forming the base layer by the spraying method such as the AD method, by spraying the fine particles of an N-type semiconductor or insulator to which the perovskite compound is attached onto the surface of the blocking layer 3, the base layer containing the perovskite compound therein can be formed.

The perovskite compound can be attached to the fine particles by, for example, a method in which the fine particles are immersed in a raw material solution in which raw materials of the perovskite compound or a precursor of the perovskite compound is dissolved, followed by drying off the solvent, thereby obtaining raw material particles having the perovskite compound attached thereto.

When a material to which the perovskite compound has been attached in advance is used for forming the base layer, the electric power generation layer 4 including the base layer containing the perovskite compound can be obtained. By further inserting or applying a perovskite compound into or on the base layer, the electric power generation layer 4 containing more perovskite compound can be obtained.

On the other hand, when the base layer containing no perovskite compound is formed, by inserting and applying a perovskite compound into the inside or onto the surface of the base layer, an electric power generation layer 4 containing a sufficient amount of the perovskite compound can be obtained.

(Formation of Upper Layer)

A method of inserting the perovskite compound into the inside of the base layer as well as forming the upper layer made of the perovskite compound on the surface of the base layer is not particularly limited, and for example, the following method can be mentioned. That is, the above-mentioned method is a method in which a raw material solution in which raw materials or a precursor of the perovskite layer are/is dissolved is applied to the surface of the base layer, so as to allow the raw material solution to impregnate into the base layer, while drying off the solvent with a solution layer having a desired thickness of the solution staying on the surface of the base layer.

At least a part of the raw material solution applied to the base layer permeates into the porous film of the base layer, and crystallization proceeds as the solvent is dried off such that the perovskite compound contacts and deposits in the inside of the porous film. Further, by applying a sufficient amount of the raw material solution, the raw material solution not having penetrated into the porous film forms the upper layer composed of the perovskite compound on the surface of the base layer as the solvent is dried off. The perovskite compound constituting the upper layer and the perovskite compound inside the base layer are integrally formed, meaning that a continuous electric power generation layer 4 is formed.

The reaction for producing the perovskite compound from the raw materials or the precursor may occur at room temperature, but heating may be carried out to promote this reaction. From the viewpoint of enhancing the photoelectric conversion efficiency, the perovskite compound may be annealed at about 40 to 150° C. Further, heating or sintering may be carried out at a temperature exceeding 150° C., if necessary.

Examples of the precursor contained in the raw material solution for the formation of the electric power generation layer 4 include a halide (BX) containing metal ions for the aforementioned B sites and halide ions for the aforementioned X sites; and a halide (AX) containing organic cations for the aforementioned A sites and halide ions for the X sites.

A single raw material solution containing the halide (AX) and the halide (BX) may be applied to the base layer, or two raw material solutions respectively containing the halides may be sequentially applied to the base layer.

The solvent for the raw material solution is not particularly limited as long as the solvent dissolves the raw material or the precursor and does not damage the base layer. Examples of the solvent include esters, ketones, ethers, alcohols, glycol ethers, amides, nitriles, carbonates, halogenated hydrocarbons, hydrocarbons, sulfones, sulfoxides, and formamide.

For example, the perovskite compound (perovskite crystals) represented by the composition formula (2) can be obtained by dissolving an alkylamine halide and a lead halide in a mixed solvent of γ-butyrolactone (GBL) and dimethyl sulfoxide (DMSO), followed by applying the solution to the base layer and drying. Furthermore, as described in Non-Patent Document 2, the production process for the perovskite compound may include an additional treatment wherein the perovskite crystals are coated with a solvent that does not dissolve the perovskite crystals and is miscible with GBL or DMSO, such as toluene or chloroform, followed by heating at about 100° C., thereby annealing the perovskite crystals. This additional treatment may improve the stability of the crystals to increase the photoelectric conversion efficiency.

The concentration of the raw materials or precursor in the raw material solution is not particularly limited, but is preferably such that the raw materials or precursor is sufficiently dissolved and the raw material solution has such a viscosity that allows the raw material solution to permeate into the porous film.

The amount of the raw material solution to be applied to the base layer is not particularly limited, but is preferably, for example, such that the raw material solution permeates into the whole or at least a part of the inside of the porous film and that an upper layer is formed on the surface of the porous film so as to have a thickness of about 1 nm to 1 μm.

The method of applying the raw material solution to the base layer is not particularly limited, and known methods such as a gravure coating method, a bar coating method, a printing method, a spraying method, a spin coating method, a dipping method and a die coating method can be employed.

The application of the raw material solution to the base layer may be carried out only once, or the application may be repeated twice or more after drying. The amount of the raw material solution for the second or later application may be the same as or different from the amount for the first application.

The method of drying the raw material solution applied to the base layer is not particularly limited, and known methods such as natural drying, reduced pressure drying and hot air drying can be employed.

The drying temperature of the raw material solution applied to the base layer is not particularly limited as long as the crystallization of the perovskite compound sufficiently proceeds, and is, for example, in the range of 40 to 150° C.

(Compound Z in Raw Material Solution)

The raw material solution used for forming the base layer and the upper layer 4$b$ contains the above-described compound Z.

In the raw material solution, the compound Z is preferably dissolved or uniformly dispersed. That is, when selecting the solvent, it is preferable to select one having compatibility with the compound Z and having a lower boiling point than the compound Z (i.e., a solvent with high volatility).

The amount of the compound Z with respect to the total mass of the raw material solution is, for example, 0.1 to 5 M. Incidentally, when the compound Z is a polymer, the molar amount of the compound Z is obtained in terms of the number of monomer units (repeating units) constituting the polymer. That is, assuming that one repeating unit is 1 mole, the number of moles of the compound Z is calculated.

In the raw material solution, the amount of the compound Z with respect to 100 parts by mass of the perovskite compound is, for example, 50 to 500 parts by mass, preferably 100 to 300 parts by mass.

<Formation of P-type Semiconductor Layer 5>

The method of forming the P-type semiconductor layer 5 is not particularly limited. For example, the P-type semiconductor layer 5 can be formed by a method in which a P-type semiconductor is dissolved or dispersed in a solvent which is a poor solvent to the perovskite compound constituting the electric power generation layer 4, and the resultant is applied to the surface of the electric power generation layer 4, followed by drying.

The concentration of the P-type semiconductor in the solution is not particularly limited and may be appropriately adjusted such that the P-type semiconductor layer 5 is appropriately formed, for example, such that the solution can be easily applied to the electric power generation layer 4 and the drying can be carried out easily.

The amount of the solution to be applied to the electric power generation layer 4 is not particularly limited, and may be appropriately adjusted according to the thickness of the P-type semiconductor layer 5 to be formed.

A method of applying the solution to the electric power generation layer 4 and a method of drying are not particularly limited. For example, it is possible to adopt the same method as mentioned above as the method for applying a raw material solution containing raw materials or a precursor of the perovskite compound to the base layer and drying.

<Formation of Second Conductive Layer 6>

The method of forming the second conductive layer 6 on the surface of the P-type semiconductor layer 5 is not particularly limited, and examples thereof include known film forming methods such as a physical vapor deposition method and a printing method, which are used in forming a transparent conductive layer of a conventional photovoltaic cell. The method may be the same as that used for forming the first conductive layer 2.

<<Photoelectric Conversion Module>>

The photoelectric conversion module of the present invention includes at least one solid junction-type photoelectric conversion element described above. The specific configuration of the photoelectric conversion module is not particularly limited, and a conventional configuration can be adopted.

A specific example of configuration of the photoelectric conversion module of the present invention will be described below with reference to FIGS. 3 and 4.

Figure 3:
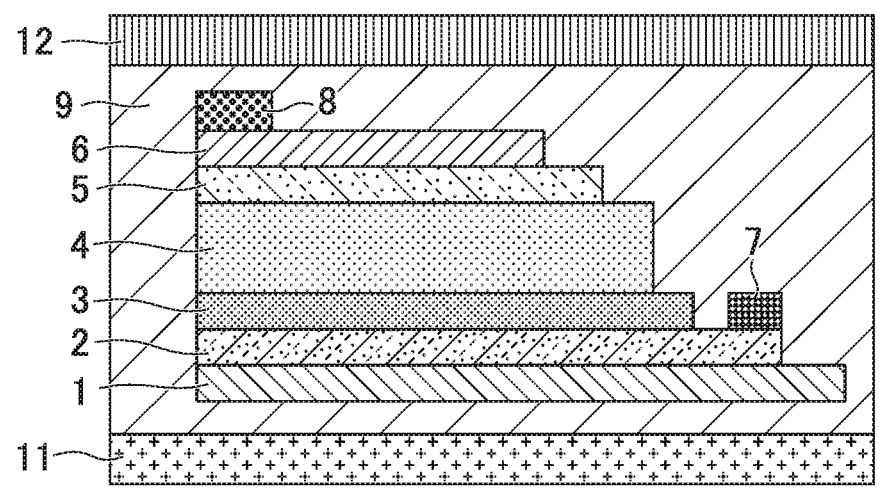
FIG. 3 is a cross-sectional view of a first embodiment of the solid junction-type photoelectric conversion module according to the present invention.

FIG. 3 is a cross-sectional view of a solid junction photoelectric conversion module including one solid junction photoelectric conversion element described above.

In FIG. 3, the first collecting electrode 7 is provided on the first conductive layer 2 of the solid junction-type photoelectric conversion element 10, and the second collecting electrode 8 is provided on the second conductive layer 6. The electric power generated by the photoelectric conversion module can be taken out to an external circuit via the first collecting electrode 7 and the second collecting electrode 8.

Such a solid junction-type photoelectric conversion element 10 is interposed between the first cover sheet 11 and the second cover sheet 12 together with the sealing material 9.

As the first collecting electrode 7 and the second collecting electrode 8, known collecting electrodes can be adopted. For example, those prepared by the method described in WO2012/147378 can be used.

The material of the sealing material 9 may be any of conventionally known sealing material, for example, a mixture of a photocurable resin and a thermosetting resin.

Materials of the first cover sheet 11 and the second cover sheet 12 are not particularly limited, and examples thereof include an insulator such as a resin, a semiconductor, a metal, a glass, and the like. Examples of the resin include poly(meth)acrylate, polycarbonate, polyester, polyimide, polystyrene, polyvinyl chloride, polyamide and the like. From the viewpoint of manufacturing a thin and light flexible and solid junction-type photoelectric conversion element 10, the substrate is preferably made of a transparent resin, more preferably a polyethylene terephthalate (PET) film or a polyethylene naphthalate (PEN) film. The material of the first cover sheet 11 and the material of the second cover sheet 12 may be different.

Figure 4:
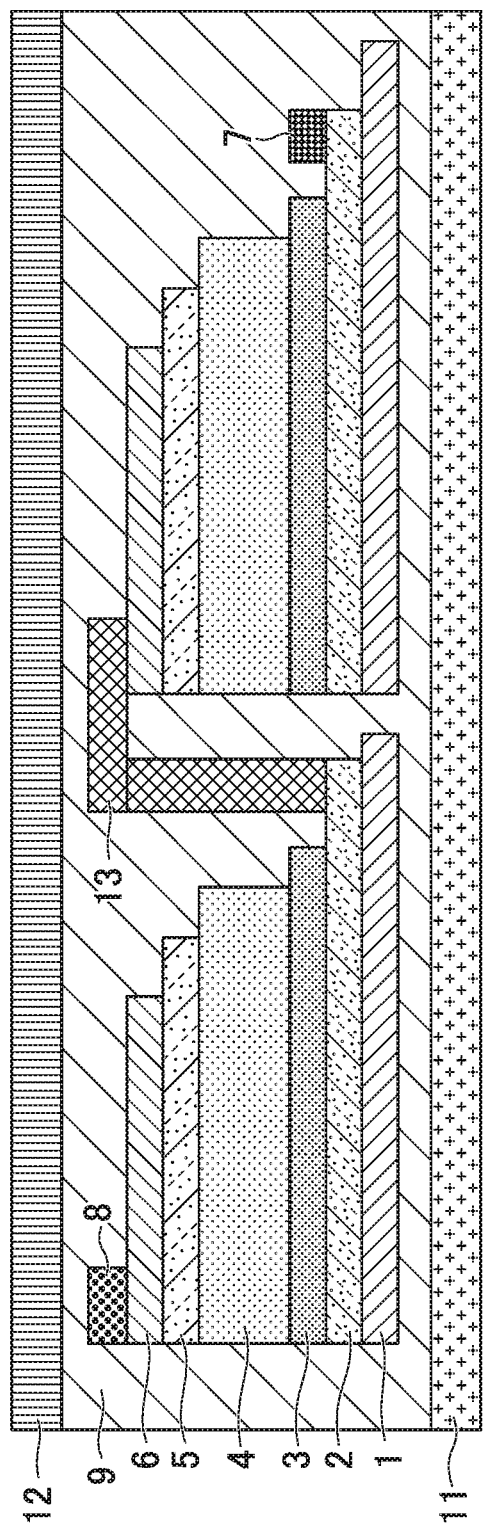
FIG. 4 is a cross-sectional view of a second embodiment of the solid junction-type photoelectric conversion module according to the present invention.

FIG. 4 is a cross-sectional view of a solid junction-type photoelectric conversion module including two solid junction-type photoelectric conversion elements connected in series.

In FIG. 4, the second collecting electrode 8 is provided on the second conductive layer 6 of one solid junction-type photoelectric conversion element 10, and the first collecting electrode 7 is provided on the first conductive layer 2 of the other solid junction-type photoelectric conversion element 20. Then, the first conductive layer 2 of the solid junction-type photoelectric conversion element 10 and the second conductive layer 6 of the solid junction-type photoelectric conversion element 20 are connected by the series connector 13.

The sealing material 9, the first cover sheet 11 and the second cover sheet 12 are the same as in the embodiment shown in FIG. 3.

The series connector 13 is not particularly limited as long as it has conductivity, and for example, one made of a metal material such as Cu, Fe, Au, Al, Ni, SUS or the like can be adopted.

EXAMPLES

Example 1

(Manufacture of Solid Junction-Type Photoelectric Conversion Element 20)

A transparent resin substrate (PEN substrate) having a transparent conductive layer (first conductive layer) made of ITO formed on its surface was prepared. An unnecessary portion of the first conductive layer was etched with hydrochloric acid to eliminate the possibility that the unnecessary portion of the first conductive layer inadvertently comes into contact with another conductive member to cause short circuit or leakage current.

Subsequently, a raw material solution in which 1 M of $CH_3NH_3I$, 1 M of $PbI_2$, and 2 M of n-decane (compound Z) were dissolved in DMF was spin-coated on the substrate and dried at 100° C. for 5 minutes to form a perovskite layer (electric power generation layer) having a thickness of 300 nm. Further, a second conductive layer composed of an Au film having a thickness of 100 nm was formed on the perovskite layer by a physical vapor deposition method, to thereby produce a solid junction-type photoelectric conversion element 20 shown in FIG. 2.

(Analysis of Compound Z Contained in Perovskite Layer)

When the second conductive layer was formed by the above physical vapor deposition method, a portion having no influence on the electric power generation performance was masked so as to leave a window where the perovskite layer was exposed without being covered by the second conductive layer. Through this window, the compound Z contained in the perovskite layer was analyzed by photoelectron spectroscopy (XPS).

As a result, a chemical state different from the chemical state of elements (bonding state of elements) constituting the perovskite compound ($ABX_3$) $CH_3NH_3PbI_3$ was detected. Specifically, a signal was detected which is attributable to a chemical state (bonding state) possessed by a central carbon atom (C-"C"-C) at the site where three carbon atoms of n-decane are linked. Further, another signal was detected which is attributable to a chemical state (bonding state) of a carbon atom (H-"C"-C) of a methyl group at the site where a carbon atom of a methylene group is bonded to a methyl group at the terminal of n-decane.

Those results confirmed that n-decane was contained in the perovskite layer. Further, it was also confirmed that n-decane was present in an amount of 3 to 7 mol per 100 mol of Pb contained in the perovskite layer.

In the XPS analysis of the above perovskite layer, no signal attributable to N,N-dimethylformamide (DMF) used as a solvent of the raw material solution was detected. That is, no signal attributable to the bond (>C=O) possessed by DMF was detected. This indicates that the amount of DMF contained in the perovskite layer was less than the detection limit. It is considered that DMF (boiling point 153° C.) had evaporated completely during the drying carried out at 100° C.

(Evaluation of Leak Frequency)

The current-voltage characteristics of the produced solid junction-type photoelectric conversion element 20 in the dark condition was measured with a source meter, and the parallel resistance Rsh was measured. In this evaluation, Rsh in the dark was defined as "(gradient of current with respect to voltage)=(voltage variation)/(current variation)" around 0 V. According to this definition, a smaller Rsh means a higher likelihood of flow of leakage current. Therefore, the photoelectric conversion elements having an Rsh of 1000 or less were evaluated as defective products having experienced occurrence of leakage current.

With respect to the twenty photoelectric conversion elements produced by the above method, presence or absence of occurrence of leakage current was checked respectively, and evaluation was made based on the following formula: leak frequency=number of defective products/(number of defective products+number of non-defective products)× 100%.

As a result, the leak frequency was 45%.

(Manufacture of Solid Junction-Type Photoelectric Conversion Element 10)

A PEN substrate provided with a first conductive layer made of ITO from which unnecessary portions were removed by etching was produced in the same manner as described above. A solution of titanium diisopropoxide bis(acetylacetonate) dissolved in isopropanol (manufactured by Sigma-Aldrich) was sprayed onto the conductive surface of the PEN substrate by a known spray pyrolysis method to form an N-type semiconductor layer (blocking layer) formed of titania with a thickness of 30 nm.

Next, a perovskite layer (electric power generation layer) having a thickness of 300 nm was formed on the N-type semiconductor layer in the same manner as described above.

Subsequently, a chlorobenzene solution containing 6.9 wt % of spiro-OMeTAD and 0.71 wt % of t-butylpyridine was coated on the perovskite layer by spin coating and dried to form a P-type semiconductor layer of spiro-OMeTAD with a thickness of 200 nm.

Finally, a second conductive layer of an Au film with a thickness of 100 nm was formed on the P-type semiconductor layer by a physical vapor deposition method, thus obtaining a solid junction-type photoelectric conversion element 10 shown in FIG. 1.

(Electric Power Generation Performance of Solid Junction-Type Photoelectric Conversion Element 10)

With respect to ten photoelectric conversion elements 10 manufactured by the same method as mentioned above, photoelectric conversion efficiency was measured using a solar simulator (AM 1.5). Arithmetic mean often measurement results was determined, and the average photoelectric conversion efficiency (average efficiency) was calculated and found to be 3.5%.

(Heat Resistance of Solid Junction-Type Photoelectric Conversion Element 10)

The ten photoelectric conversion elements 10 after measurement of initial photoelectric conversion efficiency were kept at a constant temperature of 85° C. and, 300 hours later, subjected to measurement of the average photoelectric conversion efficiency (average efficiency) in the same manner as mentioned above using a solar simulator (AM 1.5). The ratio (%) of the resulting value to the initial conversion efficiency was defined as the heat resistance maintenance ratio. The heat resistance maintenance ratio in Example 1 was 48%.

Example 2

The same procedure was repeated as in Example 1 except that n-dodecane was used as the compound Z. In the analysis by XPS, a signal was detected which is attributable to a chemical state possessed by a central carbon atom (C-"C"-C) at the site where three carbon atoms of n-dodecane are linked. Further, another signal was detected which is attributable to a chemical state (bonding state) of a carbon atom (H-"C"-C) of a methyl group at the site where a carbon atom of a methylene group is bonded to a methyl group at the terminal of n-dodecane.

Those results confirmed that n-dodecane was contained in the perovskite layer.

The leak frequency was 35%, and the average efficiency was 4.1%.

Example 3

The same procedure was repeated as in Example 1 except that 2-decanol was used as the compound Z. In the analysis by XPS, a signal was detected which is attributable to a chemical state possessed by a central carbon atom (C-"C"-C) at the site where three carbon atoms of 2-decanol are linked. Further, another signal was detected which is attributable to a chemical state of a carbon atom (H-"C"-C) of a methyl group at the site where a carbon atom of a methylene group is bonded to a methyl group at the terminal of 2-decanol. Furthermore, still another signal was detected which is attributable to a chemical state possessed by an oxygen atom (C-"O"-H) of a hydroxyl group bonded to a carbon atom of 2-decanol.

Those results confirmed that 2-decanol was contained in the perovskite layer. The leak frequency was 15%, and the average efficiency was 7.1%.

Example 4

The same procedure was repeated as in Example 1 except that 1-heptanethiol was used as the compound Z. In the analysis by XPS, a signal was detected which is attributable to a chemical state possessed by a central carbon atom (C-"C"-C) at the site where three carbon atoms of 1-heptanethiol are linked. Further, another signal was detected which is attributable to a chemical state of a carbon atom (H-"C"-C) of a methyl group at the site where a carbon atom of a methylene group is bonded to a methyl group at the terminal of 1-heptanethiol. Furthermore, still another signal was detected which is attributable to a chemical state possessed by a sulfur atom (C-"S"-H) of a thiol group bonded to a carbon atom of 1-heptanethiol. Those results confirmed that 1-heptanethiol was contained in the perovskite layer. The leak frequency was 30%, and the average efficiency was 5.6%.

Example 5

The same procedure was repeated as in Example 1 except that 1-decanethiol was used as the compound Z. In the analysis by XPS, a signal was detected which is attributable to a chemical state possessed by a central carbon atom (C-"C"-C) at the site where three carbon atoms of 1-decanethiol are linked. Further, another signal was detected which is attributable to a chemical state of a carbon atom (H-"C"-C) of a methyl group at the site where a carbon atom of a methylene group is bonded to a methyl group at the terminal of 1-decanethiol. Furthermore, still another signal was detected which is attributable to a chemical state possessed by a sulfur atom (C-"S"-H) of a thiol group bonded to a carbon atom of 1-decanethiol. Those results confirmed that 1-decanethiol was contained in the perovskite layer. The leak frequency was 40%, and the average efficiency was 5.1%.

Example 6

The same procedure was repeated as in Example 1 except that N-methyl pyrrolidone was used as the compound Z. In the analysis by XPS, a signal was detected which is attributable to a chemical state possessed by a central carbon atom (C-"C"-C) at the site where three carbon atoms of N-methyl pyrrolidone are linked. Further, another signal was detected which is attributable to a chemical state possessed by an oxygen atom (>C="O") of a carbonyl group of N-methyl pyrrolidone. Those results confirmed that N-methyl pyrrolidone was contained in the perovskite layer. The leak frequency was 5%, and the average efficiency was 9.7%.

Example 7

The same procedure was repeated as in Example 1 except that N-methyl succinimide was used as the compound Z. In the analysis by XPS, a signal was detected which is attributable to a chemical state possessed by a central carbon atom (C-"C"-C) at the site where three carbon atoms of N-methyl succinimide are linked. Further, another signal was detected which is attributable to a chemical state possessed by an oxygen atom (>C="O") of a carbonyl group of N-methyl succinimide. Those results confirmed that N-methyl succinimide was contained in the perovskite layer. The leak frequency was 20%, and the average efficiency was 7.4%.

Example 8

The same procedure was repeated as in Example 1 except that tributylphosphine was used as the compound Z. In the analysis by XPS, a signal was detected which is attributable to a chemical state possessed by a central carbon atom (C-"C"-C) at the site where three carbon atoms of tributylphosphine are linked. Further, another signal was detected which is attributable to a chemical state possessed by a phosphorus atom (C—(C—)"P"-C) bonded to three carbon atoms of tributylphosphine. Those results confirmed that tributylphosphine was contained in the perovskite layer. The leak frequency was 20%, and the average efficiency was 6.7%.

Example 9

The same procedure was repeated as in Example 1 except that dimethylsulfoxide was used as the compound Z. In the analysis by XPS, a signal was detected which is attributable to a chemical state possessed by a carbon atom (S-"C"-H) of a methyl group bonded to a sulfur atom of dimethylsulfoxide. Further, other signals were detected which are respectively attributable to a chemical state possessed by a sulfur atom (C-"S"=O) of dimethylsulfoxide, and a chemical state possessed by an oxygen atom (>S="O") of dimethylsulfoxide. Those results confirmed that dimethylsulfoxide was contained in the perovskite layer. The leak frequency was 10%, and the average efficiency was 7.9%.

Example 10

The same procedure was repeated as in Example 1 except that dimethyl sulfone was used as the compound Z. In the analysis by XPS, a signal was detected which is attributable to a chemical state possessed by a carbon atom (S-"C"-H) of a methyl group bonded to a sulfur atom of dimethyl sulfone. Further, other signals were detected which are respectively attributable to a chemical state possessed by a sulfur atom (C-"S"=O) of dimethyl sulfone, and a chemical state possessed by an oxygen atom (>S="O") of dimethyl sulfone. Those results confirmed that dimethyl sulfone was contained in the perovskite layer. The leak frequency was 10%, and the average efficiency was 9.4%.

Example 11

The same procedure was repeated as in Example 1 except that diisopropyl sulfite was used as the compound Z. In the analysis by XPS, a signal was detected which is attributable to a chemical state possessed by a carbon atom (O-"C"-H) of a methyl group bonded to an oxygen atom of diisopropyl sulfite. Further, other signals were detected which are respectively attributable to a chemical state possessed by a sulfur atom (O-"S"=O) of diisopropyl sulfite, and a chemical state possessed by an oxygen atom (>S="O") of diisopropyl sulfite. Those results confirmed that diisopropyl sulfite was contained in the perovskite layer. The leak frequency was 15%, and the average efficiency was 9.5%.

Example 12

The same procedure was repeated as in Example 1 except that triethyl phosphate was used as the compound Z. In the analysis by XPS, a signal was detected which is attributable to a chemical state possessed by a central carbon atom (C-"C"-H) in an ethyl group of triethyl phosphate. Further, another signal was detected which is attributable to a chemical state possessed by a phosphorus atom ((O—)$_3$"P"=O) bonded to four oxygen atoms of triethyl phosphate. Those results confirmed that triethyl phosphate was contained in the perovskite layer. The leak frequency was 10%, and the average efficiency was 6.5%.

Example 13

The same procedure was repeated as in Example 1 except that 1 M each of N-methyl pyrrolidone and dimethyl sulfone were used as two types of the compound Z's. In the analysis by XPS, the above-described signals were detected with respect to the carbon atom, oxygen atom and sulfur atom possessed by N-methyl pyrrolidone and dimethyl sulfone. Those results confirmed that N-methyl pyrrolidone and dimethyl sulfone were contained in the perovskite layer. The leak frequency was 10%, and the average efficiency was 8.5%.

Example 14

The same procedure was repeated as in Example 1 except that 1M each of dimethyl sulfone and triethyl phosphate were used as two types of the compound Z's. In the analysis by XPS, the above-described signals were detected with respect to the carbon atom, sulfur atom, oxygen atom and phosphorus atom possessed by dimethyl sulfone and triethyl phosphate. Those results confirmed that dimethyl sulfone and triethyl phosphate was contained in the perovskite layer. The leak frequency was 15%, and the average efficiency was 7.1%.

Examples 15 to 30

Solid junction-type photoelectric conversion elements were produced and evaluated in the same manner as in Example 1, except that the type and amount of the compound Z were varied as shown in Tables 2 and 3.

Comparative Example 1

The same procedure was repeated as in Example 1 except that a perovskite layer was formed using a raw material solution not containing the compound Z. As a result, the leak frequency was 70%, and the average efficiency was 1.4%.

The results of the Examples and Comparative Example are shown in Tables 1 to 3.

TABLE 1

| | Compound Z | Amount of compound Z contained in electric power generation layer | Chemical state particular to compound Z | Leak frequency (%) | Average efficiency (%) | Heat resistance maintenance ratio (%) |
|---|---|---|---|---|---|---|
| Ex. 1 | n-decane | Approx. 5% | C(C—"C"—C) C(H—"C"—C) | 45 | 3.5 | 48 |
| Ex. 2 | n-dodecane | Approx. 7% | C(C—"C"—C) C(H—"C"—C) | 35 | 4.1 | 41 |
| Ex. 3 | 2-decanol | Approx. 3% | C(C—"C"—C) C(H—"C"—C) O(C—"O"—H) | 15 | 7.1 | 46 |
| Ex. 4 | 1-heptanethiol | Approx. 10% | C(C—"C"—C) C(H—"C"—C) S(C—"S"—H) | 30 | 5.6 | 58 |
| Ex. 5 | 1-decanethiol | Approx. 12% | C(C—"C"—C) C(H—"C"—C) S(C—"S"—H) | 40 | 5.1 | 51 |
| Ex. 6 | N-methyl pyrrolidone | Approx. 2% | C(C—"C"—C) O(C="O") | 5 | 7.1 | 45 |
| Ex. 7 | N-methyl succinimide | Approx. 4% | C(C—"C"—C) O(C="O") | 20 | 7.4 | 45 |
| Ex. 8 | tributylphosphine | Approx. 6% | C(C—"C"—C) P(C—"P"—C) | 20 | 6.7 | 65 |
| Ex. 9 | dimethyl sulfoxide | Approx. 4% | C(S—"C"—H) S(C—"S"—O) O(S="O") | 20 | 7.9 | 64 |
| Ex. 10 | dimethylsulfone | Approx. 4% | C(S—"C"—H) S(C—"S"—O) O(S="O") | 10 | 9.4 | 81 |
| Ex. 11 | diisopropyl sulfite | Approx. 9% | C(O—"C"—H) S(O—"S"—O) O(S="O") | 15 | 9.5 | 76 |
| Ex. 12 | triethyl phosphate | Approx. 8% | C(H—"C"—C) P(O—"P"=O) O(P="O") | 10 | 6.5 | 74 |
| Ex. 13 | N-methyl pyrrolidone dimethylsulfone | Approx. 1% Approx. 2% | C(C—"C"—C) O(C="O") S(C—"S"—O) | 10 | 8.5 | 68 |
| Ex. 14 | dimethylsulfone triethyl phosphate | Approx. 2% Approx. 3% | C(S—"C"—H) S(C—"S"—O) O(S="O") P(O—"P"=O) | 15 | 8.9 | 79 |

TABLE 2

| | Compound Z | Amount of compound Z contained in electric power generation layer | Chemical state particular to compound Z | Leak frequency (%) | Average efficiency (%) | Heat resistance maintenance ratio (%) |
|---|---|---|---|---|---|---|
| Ex. 15 | ethyl methyl sulfone | Approx. 15% | C(S—"C"—H) S(C—"S"—O) O(S="O") | 0 | 9.9 | 80 |
| Ex. 16 | diphenyl sulfone | Approx. 15% | C(S—"C"—H) S(C—"S"—O) O(S="O") | 0 | 10.1 | 84 |
| Ex. 17 | 4-Benzyloxyphenyl 4 hydroxyphenyl sulfone | Approx. 12% | C(S—"C"—H) S(C—"S"—O) O(S="O") | 0 | 8.9 | 81 |
| Ex. 18 | Styrene TFSI* | Approx. 12% | C(S—"C"—H) S(C—"S"—O) O(S="O") F(F—C) | 0 | 10.5 | 85 |
| Ex. 19 | PMMA | Approx. 10% | C(C=O) O(C=O) | 0 | 7.8 | 75 |
| Ex. 20 | polyacrylamide | Approx. 15% | C(C=O) O(O=O) | 0 | 8.1 | 78 |
| Ex. 21 | TFPMMA | Approx. 15% | C(C=O) O(O=O) F(F—C) | 0 | 12.7 | 94 |
| Ex. 22 | Polystyrene | Approx. 15% | C(S—"C"—H) S(C—"S"—O) O(S="O") F(F—C) | 0 | 11.2 | 78 |
| Ex. 23 | polysulfone | Approx. 15% | C(S—"C"—H) S(C—"S"—O) O(S="O") F(F—C) | 0 | 12.3 | 84 |

TABLE 3

| | Compound Z | Amount of compound Z contained in electric power generation layer | Chemical state particular to compound Z | Leak frequency (%) | Average efficiency (%) | Heat resistance maintenance ratio (%) |
|---|---|---|---|---|---|---|
| Ex. 24 | PATFSI | Approx. 12% | C(S—"C"—H) S(C—"S"—O) O(S="O") F(F—C) | 0 | 13.5 | 98 |
| Ex. 25 | PolystyreneTCSI | Approx. 11% | C(S—"C"—H) S(C—"S"—O) O(S="O") Cl(Cl—C) | 0 | 13.2 | 95 |
| Ex. 26 | PolystyreneTFSI | Approx. 12% | C(S—"C"—H) S(C—"S"—O) O(S="O") F(F—C) | 0 | 13.8 | 98 |
| Ex. 27 | PolystyreneTFSI2 | Approx. 10% | C(S—"C"—H) S(C—"S"—O) O(S="O") F(F—C) | 0 | 13.4 | 96 |
| Ex. 28 | PMMATFSI | Approx. 15% | C(S—"C"—H) S(C—"S"—O) O(S="O") F(F—C) | 0 | 12.1 | 89 |
| Ex. 29 | methyl cellulose | Approx. 15% | C(S—"C"—H) S(C—"S"—O) O(S="O") F(F—C) | 0 | 11.2 | 87 |
| Ex. 30 | ethyl cellulose | Approx. 15% | C(S—"C"—H) S(C—"S"—O) O(S="O") F(F—C) | 0 | 11.3 | 85 |

TABLE 3-continued

| Compound Z | Amount of compound Z contained in electric power generation layer | Chemical state particular to compound Z | Leak frequency (%) | Average efficiency (%) | Heat resistance maintenance ratio (%) |
|---|---|---|---|---|---|
| Comp. Ex. 1 | — | Not calculated Below detection limit (Approx. 0.1% or less) | — | 70 | 1.4 | 32 |

In Tables 1 to 3, "Amount of compound Z contained in electric power generation layer" means a mol % of each compound Z with respect to 100 mol % of the element lead of the perovskite compound contained in the electric power generation layer. When the compound Z was a polymer, the mol % was calculated based on the number of repeating units.

In Tables 1 to 3, "Element in chemical state particular to the compound Z" is a type of a chemical state (bonding state) absent in the perovskite compound, and the element in the particular chemical state is shown in quotation marks (" ") in the parenthesis with elements bonded to both sides of the element.

From the results shown in Tables 1 to 3, it is clear that the photoelectric conversion elements of the Examples containing compound Z in the electric power generation layer excel in leakage frequency and have higher average efficiency as compared to the photoelectric conversion element of Comparative Example 1 not containing compound Z. Furthermore, the results also show that the photoelectric conversion elements of the Examples have higher heat resistance maintenance ratio and, hence, have higher heat resistance, as compared to the photoelectric conversion element of Comparative Example 1. Therefore, it is apparent that the solid junction-type photoelectric conversion element according to the present invention is not likely to suffer from a leakage current and has excellent heat resistance.

Reference Example

Furthermore, the semiconductor characteristics of the perovskite layer were evaluated with respect to the conditions of Example 26 where particularly high average efficiency was observed. Specifically, the same procedure as in the production of the photoelectric conversion element in Example 26 was followed up to the completion of the perovskite layer and the ionization potential was measured by photoelectron spectroscopy. The results are shown in Table 4. It was found that the resulting perovskite layer containing TFSI (polystyrene substituted with a bisulfonylimide residue having a trifluoromethyl group) had a deeper ionization potential as compared to the case of a perovskite layer containing no additive (Comparative Example 1) and the case of a perovskite layer containing unsubstituted polystyrene (Example 22). This suggests that the bissulfonylimide residue of the additives was involved in the P-type doping of the perovskite layer.

TABLE 4

| | Compound Z | Ionization Potential |
|---|---|---|
| Ex. 22 | Polystyrene | 5.6 eV |
| Ex. 26 | Polystyrene TFSI | 5.8 eV |
| Comp. Ex. 1 | — | 5.6 eV |

The elements, combinations thereof, etc. that are explained above in connection with the specific embodiments of the present invention are mere examples, and various alterations such as addition, omission and substitution of any components, etc. may be made as long as such alterations do not deviate from the gist of the present invention.

DESCRIPTION OF THE REFERENCE SIGNS

1 Substrate
2 First Conductive Layer
3 Blocking Layer
4 Electric Power Generation Layer
5 P-type Semiconductor Layer
6 Second Conductive Layer
7 First Collecting Electrode
8 Second Collecting Electrode
9 Sealing Material
10,20 Solid Junction-type Photoelectric Conversion Element
11 First Cover Sheet
12 Second Cover Sheet
13 Series Connector

The invention claimed is:

1. A solid junction-type photoelectric conversion element comprising a first conductive layer, an electric power generation layer, and a second conductive layer, which are laminated in this order, wherein the electric power generation layer comprises:
   a perovskite compound represented by a composition formula $ABX_3$, formed of an organic cation A, a metal cation B and a halide anion X, and a compound Z having no perovskite structure,
   wherein the solid junction-type photoelectric conversion element has a leak frequency of 45% or less, an average photoelectric conversion efficiency of 3.5 or more, and a heat resistance maintenance ratio of 41 or more, wherein:
   the leak frequency is measured by a method involving subjecting the solid junction-type photoelectric conversion element to a measurement of current-voltage characteristics in a dark condition with a source meter, to measure a parallel resistance Rsh defined as (gradient of current with respect to voltage)=(voltage variation)/(current variation) around 0 V, repeating the measurement with respect to 20 pieces of the solid junction-type photoelectric conversion element to check presence or absence of occurrence of leakage current, and calculating the leak frequency by a formula: number of defective products/(number of defective products+number of non-defective products)×100%;

the average photoelectric conversion efficiency is an arithmetic mean value of photoelectric conversion efficiency measured using a solar simulator with respect to 10 pieces of the solid junction-type photoelectric conversion element; and the heat resistance maintenance ratio is measured by a method involving keeping the 10 pieces of the solid junction-type photoelectric conversion element used for measuring the average photoelectric conversion efficiency as a value (i) at a constant temperature of 85° C. and, 300 hours later, followed by a 2nd measurement of the average photoelectric conversion efficiency as a value (ii) in the same manner as mentioned above using the solar simulator, and calculating a ratio (%) of the value (ii) to the value (i) as the heat resistance maintenance ratio.

2. The solid junction-type photoelectric conversion element according to claim 1, wherein the compound Z comprises two or more elements z belonging to Groups 14 to 16 of the periodic table.

3. The solid junction-type photoelectric conversion element according to claim 2, wherein the two or more elements z include a first element z having a highest electronegativity and a second element z having a lowest electronegativity among the elements z, and a difference in electronegativity between the first element z and the second element z is 0.1 or more.

4. The solid junction-type photoelectric conversion element according to claim 1, wherein the compound Z has at least one group selected from an ether group (—O—), a hydroxyl group (—OH), a carbonyl group (>C=O), a sulfo group (—SO$_3$H), a thiol group (—SH), a sulfenyl group (R$^1$S—; R$^1$ is a monovalent organic group), a sulfonyl group (—S(=O)$_2$—), a sulfite group (R$^1$O—S(=O)—O—; R$^1$ is a monovalent organic group), a phosphine group (>P—), a phosphono group {(R$^1$O)$_2$P(=O)—; each R$^1$ independently represents a monovalent organic group)}, and a R$^1$O— group (R$^1$ is a monovalent organic group).

5. The solid junction-type photoelectric conversion element according to claim 1, wherein the compound Z has a group having a structure represented by formula (1) below:

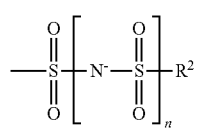

(1)

wherein R$^2$ is an alkyl group having 1 to 15 carbon atoms, a halogenated alkyl group having 1 to 15 carbon atoms, an aryl group having 6 to 15 carbon atoms, a halogenated aryl group having 6 to 15 carbon atoms, or a halogen atom, and n is 0 or 1.

6. The solid junction-type photoelectric conversion element according to claim 5, wherein the compound Z is a compound having a structure represented by formula (2) below:

(2)

wherein each of R$^3$ is independently a group represented by the formula (1) or a hydrogen atom, and at least one of multiple groups R$^3$ is a group represented by the formula (1), and n is an integer from 2 to 30,000.

7. A perovskite film, comprising: a perovskite compound represented by a composition formula ABX$_3$, formed of an organic cation A, a metal cation B and a halide anion X; and the compound Z described in claim 5.

8. The solid junction-type photoelectric conversion element according to claim 1, wherein the compound Z is a compound having a structure represented by formula (3) below:

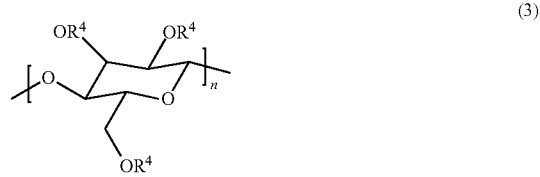

(3)

wherein each R$^4$ independently represents a hydrogen atom or a hydrocarbon group, and n is an integer of from 2 to 30000.

9. The solid junction-type photoelectric conversion element according to claim 1, which comprises at least two compounds as the compound Z.

10. A photoelectric conversion module, comprising at least one solid junction-type photoelectric conversion element according to claim 1.

11. A method for producing the solid junction-type photoelectric conversion element of claim 1, comprising forming the electric power generation layer by applying a raw material solution containing a homogeneous mixture of raw materials or a precursor of the perovskite compound, and the compound Z to a substrate, followed by drying.

* * * * *